United States Patent
Hou et al.

(10) Patent No.: US 7,421,355 B2
(45) Date of Patent: *Sep. 2, 2008

(54) MEASURING APPARATUS, MEASURING METHOD, TESTING APPARATUS, TESTING METHOD, AND ELECTRONIC DEVICE

(75) Inventors: Harry Hou, Santa Clara, CA (US); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/550,811

(22) Filed: Oct. 19, 2006

(65) Prior Publication Data
US 2007/0260947 A1  Nov. 8, 2007

Related U.S. Application Data

(63) Continuation-in-part of application No. 11/362,536, filed on Feb. 27, 2006, now Pat. No. 7,398,169.

(51) Int. Cl.
*G06F 19/00* (2006.01)

(52) U.S. Cl. .............. 702/69; 702/66; 702/71; 702/82; 324/121 R; 324/158.1; 324/532; 324/763

(58) Field of Classification Search ........... 702/63, 702/69, 66, 71, 75, 82–89; 324/763, 121 R, 324/158.1, 532
See application file for complete search history.

(56) References Cited

U.S. PATENT DOCUMENTS

2007/0203659 A1 * 8/2007 Yamaguchi et al. ........... 702/69

FOREIGN PATENT DOCUMENTS

| JP | 10-288653 | 10/1998 |
|---|---|---|
| JP | 2001-289892 | 10/2001 |
| JP | 2004-093345 | 3/2004 |
| JP | 2004-125552 | 4/2004 |
| JP | 2005-189093 | 7/2005 |
| WO | WO 00/46606 | 8/2000 |

OTHER PUBLICATIONS

*Jitter Measurements for CLK Generators or Synthesizers*, Maxim Integrated Products, Sep. 26, 2003, pp. 1-4.

* cited by examiner

*Primary Examiner*—John E. Barlow, Jr.
*Assistant Examiner*—Hien X Vo
(74) *Attorney, Agent, or Firm*—Sterne, Kessler, Goldstein & Fox P.L.L.C.

(57) ABSTRACT

There is provided a measuring apparatus for measuring a signal-under-test, having a comparator for sequentially comparing voltage values of the signal-under-test with a threshold voltage value fed thereto at timing of strobe signals sequentially fed thereto, a strobe timing generator for sequentially generating the strobe signals placed almost at equal time intervals, a capture memory for storing the comparison result of the comparator and a digital signal processing section for calculating jitter of the signal-under-test based on the comparison result stored in the capture memory.

38 Claims, 27 Drawing Sheets

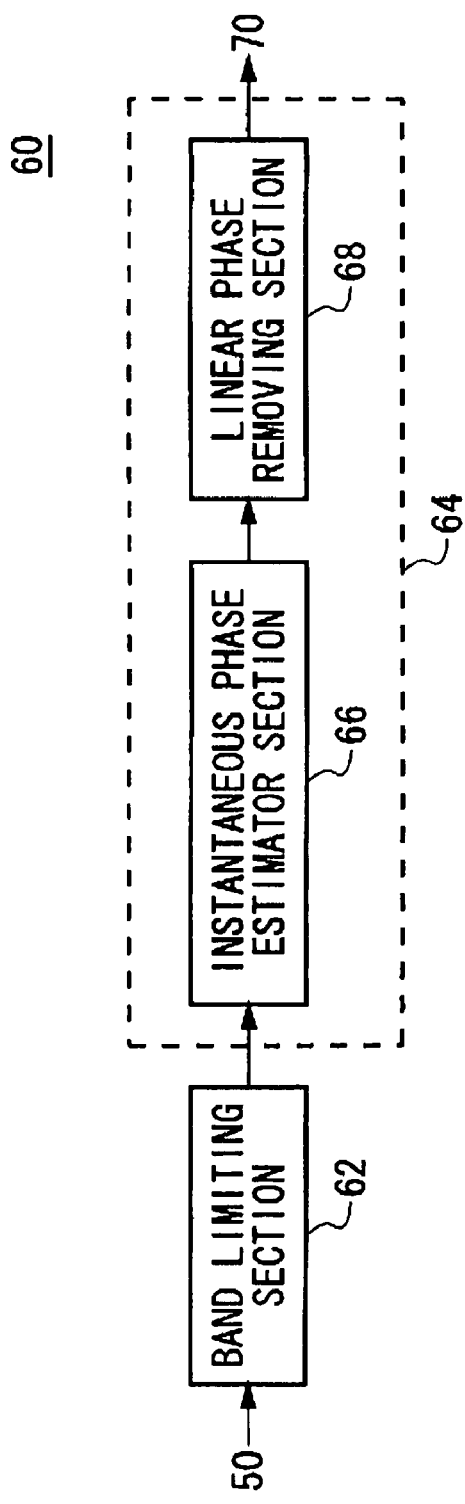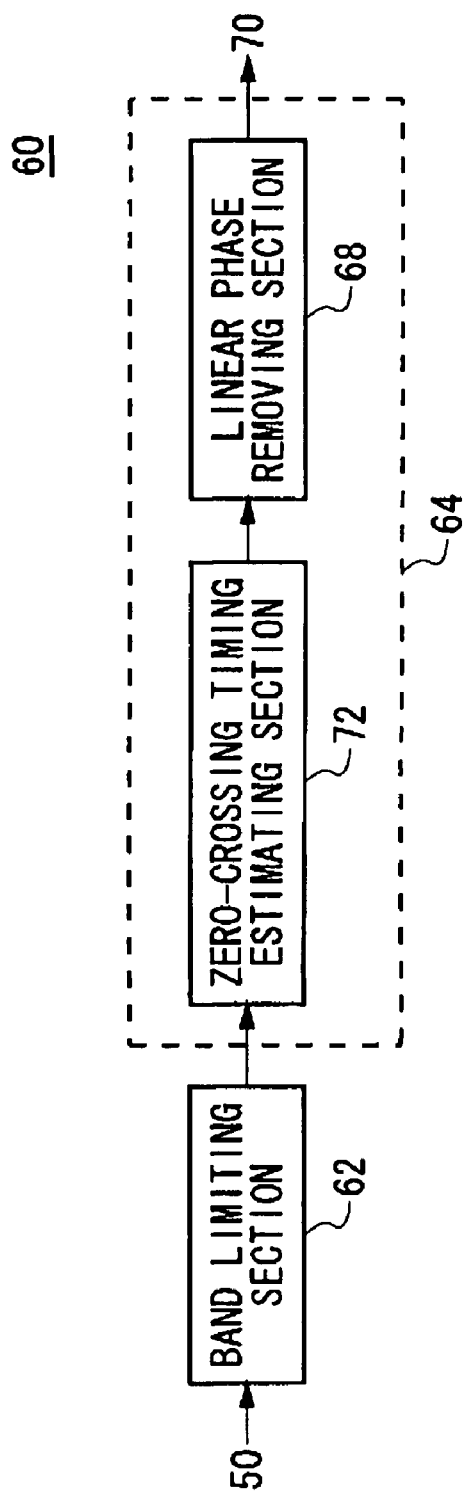

| Method | $\Delta\phi_{RMS}$ | | |
|---|---|---|---|
| | CONVENTIONAL METHOD | TEST APPARATUS 100 | |
| | 8 bit | 1.6 bit | difference |
| Quiet | 63.6 ps | 65.8 ps | 3.3 % |
| Noisy | 61.4 ps | 63.8 ps | 3.9 % |
| Number of Events | 4526 | 4526 | 0 % |

FIG. 7

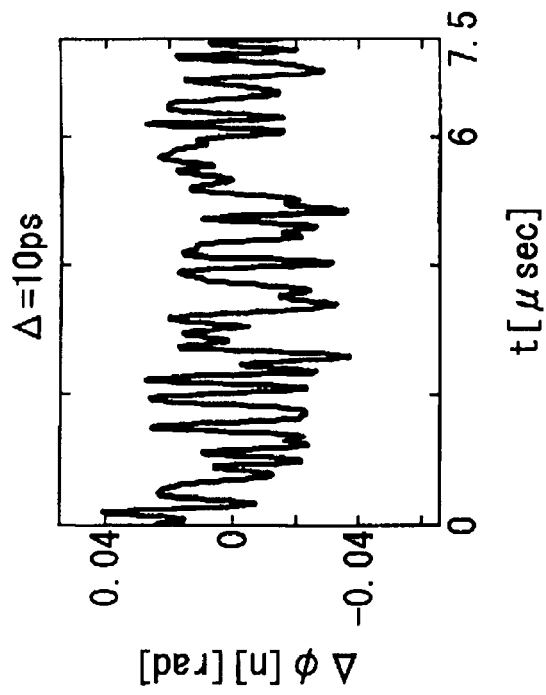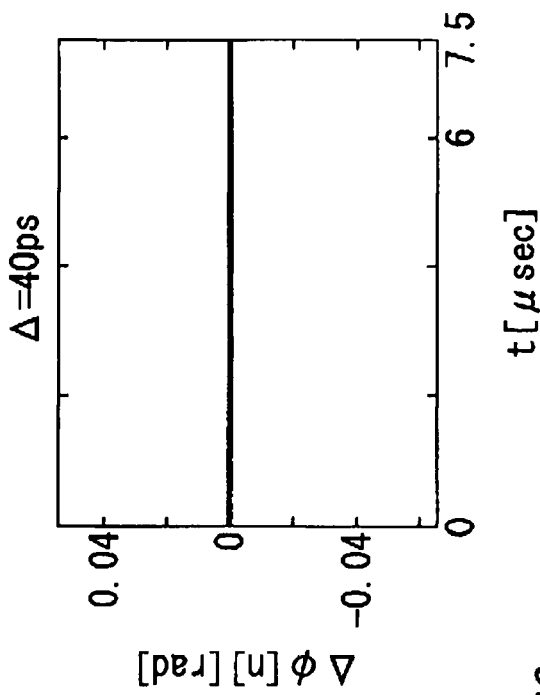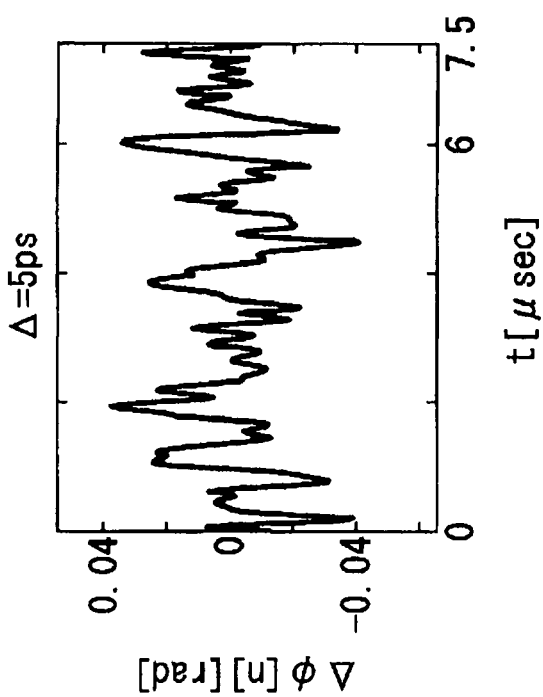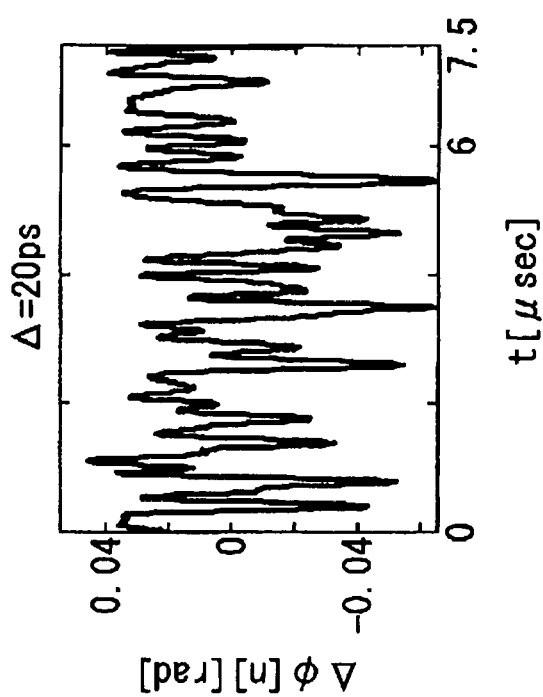
FIG. 22

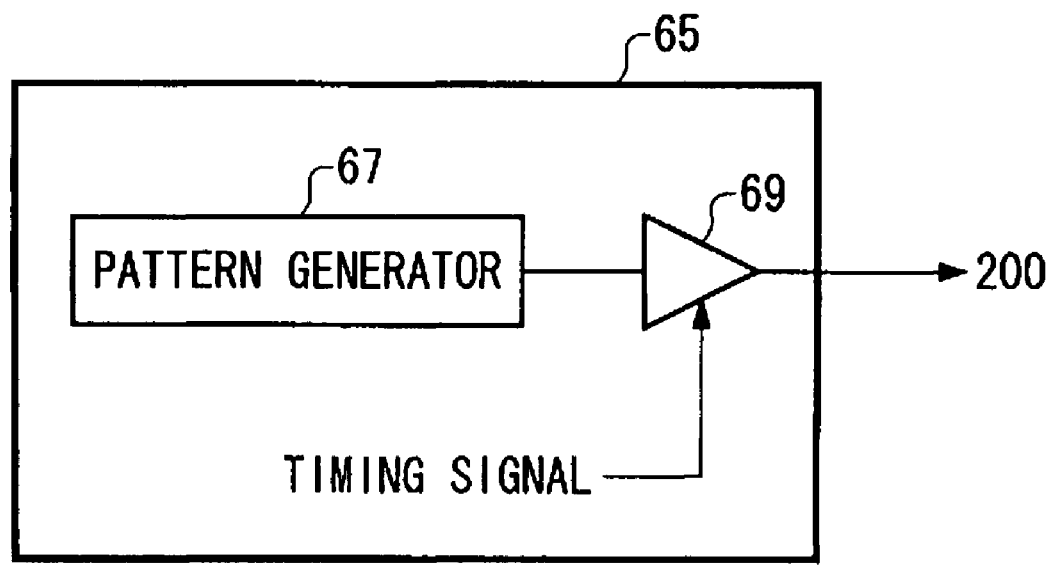
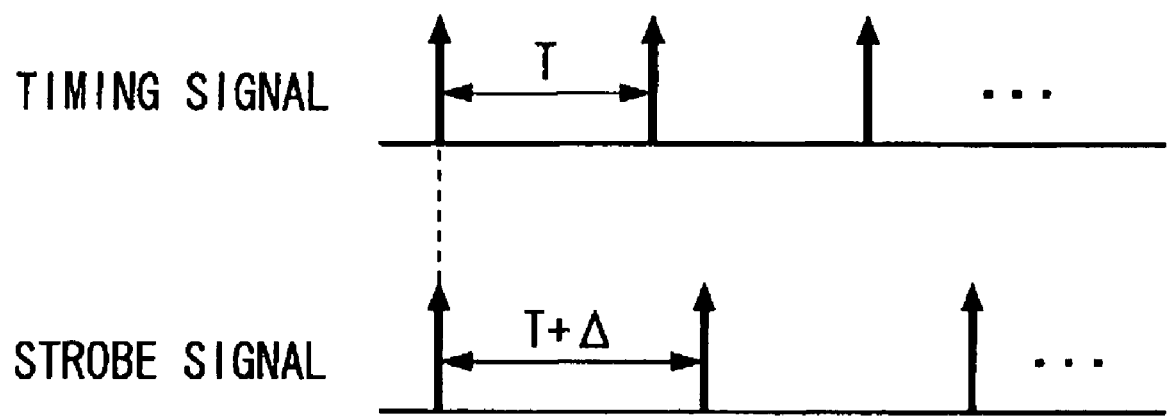
FIG. 25

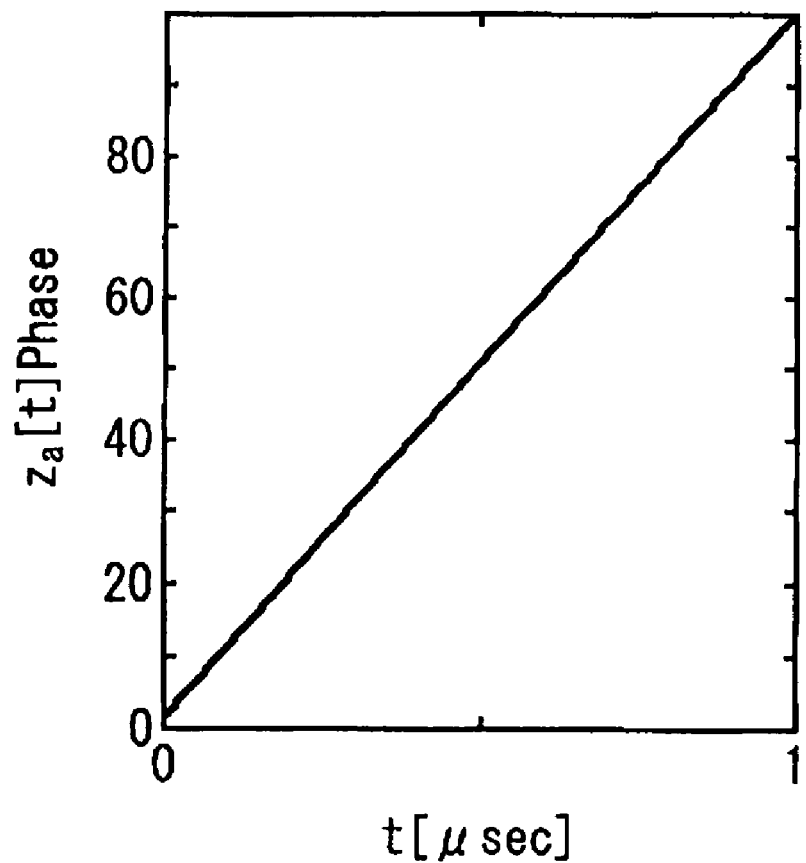
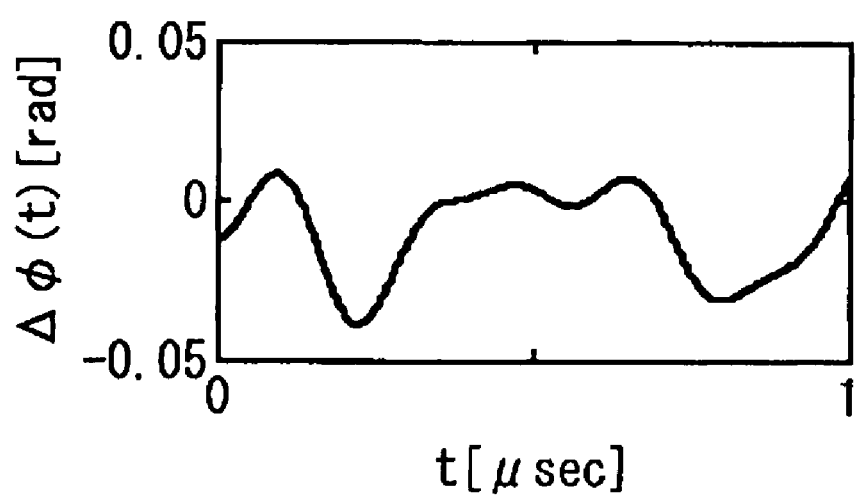
*FIG. 26*

MEASURING APPARATUS, MEASURING METHOD, TESTING APPARATUS, TESTING METHOD, AND ELECTRONIC DEVICE

CROSS REFERENCE TO RELATED APPLICATION

This application is a continuation-in-part of U.S. patent application Ser. No. 11/362,536, filed Feb. 27, 2006 now U.S. Pat. No. 7,398,169, and which is being incorporated in its entirety herein by reference.

BACKGROUND

1. Field of the Invention

The present invention relates to a measuring apparatus and a measuring method for measuring a signal-under-test, a testing apparatus and a testing method for testing a device-under-test and an electronic device. More specifically, the invention relates to a measuring apparatus, a measuring method, a testing apparatus and a testing method for measuring jitters in the signal-under-test outputted out of the device-under-test.

2. Related Art

There has been known a test for measuring jitter in a signal-under-test outputted out of an electronic device such as a semiconductor circuit as an item for testing the electronic device. For example, jitter of such signal-under-test is measured by a time interval analyzer, an oscilloscope or the like by inputting the signal-under-test thereto. The time interval analyzer or the like allows such jitter to be calculated by measuring phase errors of edges in the signal-under-test for example.

Still more, there has been known a functional test for judging whether or not a pattern of a signal-under-test outputted out of an electronic device coincides with a pattern of an expected values as an item for testing the electronic device. In this test, a testing apparatus detects a data pattern of the signal-under-test by comparing a voltage values of the signal-under-test outputted out of the electronic device with threshold voltage when a predetermined test pattern is inputted to the electronic device. Then, it judges whether or not the data pattern coincides with the pattern of the expected values.

It has been thus necessary to prepare the apparatus for measuring jitter and the apparatus for testing functionality of the device in order to carry out the jitter test in addition to functional tests as described above. Therefore, it has been costly to carry out the jitter test.

Still more, the apparatus of functional test compares the voltage value of the signal-under-test with the threshold voltage at preset timing. Therefore, it can detect the edge position or timing, over which the data pattern of the signal-under-test transits bit by bit, by shifting the comparison timing. It is then conceivable to be able to measure jitter by utilizing this function, i.e., by using the apparatus for performing functional testing.

However, the conventional apparatus for functional testing sets and uses sampling timings based on a test rate synchronized with the operating period of the signal-under-test. Therefore, for each test rate it is necessary to set phase of the sampling timing in order to gradually shift the relative phase of the sampling timing with respect to the signal-under-test within each test rate. It has been thus necessary to carry out the cumbersome timing setting in order to carry out the jitter test, and it has taken a significantly long time for testing. Still more, its measuring accuracy is insufficient and is not suitable for tests because its timing is shifted in the relative phase fashion.

When jitter is measured by using an oscilloscope or the like, the signal-under-test to be inputted therein contains amplitude noise components in addition to the timing noise component. Therefore, it has been difficult to accurately measure only the timing noise of the signal-under-test.

Accordingly, it is an advantage of the invention to provide a measuring apparatus, a measuring method, a testing apparatus, a testing method and an electronic device, which are capable of solving the above-mentioned problem. This advantage may be achieved through the combination of features described in independent claims of the invention. Dependent claims thereof specify preferable embodiments of the invention.

SUMMARY

In order to solve the above-mentioned problems, according to a first aspect of the invention, there is provided a measuring apparatus for measuring a signal-under-test, having a comparator for sequentially comparing voltage values of the signal-under-test with a threshold voltage value fed thereto at timing of strobe signals sequentially fed thereto, a strobe timing generator for sequentially generating the strobe signals disposed almost at equal time intervals, a capture memory for storing the comparison result of the comparator and a digital signal processing section for calculating jitter of the signal-under-test based on the comparison result stored in the capture memory.

The strobe timing generator may sequentially generate the strobe signals at the cycle different from that of the signal-under test by a predetermined value. The strobe timing generator may sequentially generate the strobe signals at a cycle larger than half of that of the signal-under-test.

The strobe timing generator may sequentially generate the strobe signals such that the difference between the cycle of the strobe signal and that of the signal-under-test is an equivalent sampling interval dependent on a jitter value to be measured.

The strobe timing generator may provide the jitter value to be measured and sequentially generate the strobe signals such that the difference between the cycle of the strobe signal and that of the signal-under-test is less than N times of jitter value, where N is a positive integer.

The strobe timing generator may sequentially generate the strobe signals such that the difference between the cycle of the strobe signal and that of the signal-under-test is a value dependent on a time resolution for calculating jitter.

The strobe timing generator may sequentially generate the strobe signals such that the time resolution for calculating jitter is provided and the difference between the cycle of the strobe signal and that of the signal-under-test is less than the time resolution.

The digital signal processing section may divide the cycle of the signal-under-test by the difference between the cycle of the strobe signal and that of the signal-under-test, retrieve continuous data with the number of points which is integral multiple of the division result and calculate the jitter based on the retrieved data.

When the number of points of the captured data is power-of-two, the digital data processing section calculate jitter based on the result obtained by performing a fast Fourier Transform on the retrieved data. Alternatively, when the number of points of the captured data is not power-of-two, the digital data processing section calculate jitter based on the result obtained with the mixed-radix algorithm.

The measuring apparatus may further include a digital signal converting section for generating a digital signal in which each voltage value of the signal-under-test is converted into a digital value whose absolute value falls within a range smaller than n (where, n is a real number) based on the comparison result stored in the capture memory, and the digital signal processing section may calculate the jitter of the signal-under-test based on the digital signal.

The comparator may output the comparison results different from each other depending on whether or not the voltage value of the signal-under-test is greater than the threshold voltage value. The digital value converting section may convert the comparison result representing that the voltage value of the signal-under-test is greater than the threshold voltage value into a digital value of 1 and may convert the comparison result representing that the voltage value of the signal-under-test is smaller than the threshold voltage value into a digital value of −1.

The comparator may receive first one of the threshold voltage and second one of the threshold voltage whose voltage value is lower than the first threshold voltage and may output the comparison results different from each other depending on whether or not the voltage value of the signal-under-test is greater than the first threshold voltage, whether or not the voltage value of the signal-under-test is smaller than the first threshold voltage and greater than the second threshold voltage or whether the voltage value of the signal-under-test is smaller than the second threshold voltage. The digital signal converting section may convert the comparison result indicating that the voltage value of the signal-under-test is greater than the first threshold voltage value into a digital value 1, may convert the comparison result indicating that the voltage value of the signal-under-test is smaller than the first threshold voltage value and is greater than the second threshold voltage value into a digital value 0 and may convert the comparison result indicating that the voltage value of the signal-under-test is smaller than the second threshold voltage value into a digital value −1.

The comparator may receive three or more different threshold voltage values and may output comparison results different from each other depending on a voltage range specified by two neighboring threshold voltages to which the voltage value of the signal-under-test belongs.

The strobe timing generator may generate the strobe signals disposed almost at equal time intervals independently of operation periods of the measuring apparatus. The strobe timing generator may generate one of the strobe signals per operation period of the measuring apparatus. The strobe timing generator may generate the plurality of strobe signals per operation period of the measuring apparatus.

The digital signal processing section may have a band limiting section for passing a frequency component to be measured of the digital signal and a phase distortion estimating section for calculating phase noise of the digital signal outputted out of the band limiting section.

The band limiting section may convert the digital signal into an analytic signal, and the phase distortion estimating section may have an instantaneous phase estimating section for generating an instantaneous phase signal representing the instantaneous phase of the signal-under-test and a linear phase removing section for removing a linear component of the instantaneous phase signal to calculate phase noise of the signal-under-test.

The phase distortion estimating section may have a zero-crossing timing estimating section for estimating zero-crossing timing series of the signal-under-test based on the digital signals outputted out of the band limiting section and a linear phase removing section for removing a linear component of the zero-crossing timing series to calculate phase noise of the signal-under-test.

The measuring apparatus may further include a filter for passing the frequency component to be measured of the signal-under-test to input to the comparator. The filter may pass a frequency component of frequency band containing no carrier frequency of the signal-under-test among frequency components of the signal-under-test.

The measuring apparatus may further include a plurality of comparators arranged in parallel and an input section for inputting the signal-under-test into each one of the plurality of comparators in parallel, and the strobe timing generator may input the strobe signals whose phases are different to the respective comparators and the capture memory may align and store the comparison results in the plurality of comparators in accordance to phases of the corresponding strobe signals.

The strobe timing generator may generate the strobe signals to be inputted to the comparators based on phases of a triggering signal synchronized with the signal-under-test. The measuring apparatus may further include a clock regenerator for generating a recovered clock synchronized with the signal-under-test and for inputting the recovered clock to the strobe timing generator as the triggering signal.

The strobe timing generator may sequentially input the plurality of strobe signals whose phases are different with respect to the triggering signal to the respective comparators and the capture memory may align and store the comparison results outputted out of the comparators corresponding to the respective triggering signals in accordance to the phases of the corresponding strobe signals.

According to a second aspect of the invention, there is provided a testing apparatus for testing a device-under-test, having a measuring apparatus for measuring jitter of a signal-under-test outputted out of the device-under-test, and a jitter judging section for judging whether or not the device-under-test is defect-free based on the jitter measured by the measuring apparatus, wherein the measuring apparatus has a comparator for sequentially comparing voltage values of the signal-under-test with a threshold voltage value given thereto at timing of strobe signals sequentially fed thereto, a strobe timing generator for sequentially generating the strobe signals disposed almost at equal time intervals, a capture memory for storing comparison results of the comparator and a digital signal processing section for calculating the jitter of the signal-under-test based on the comparison results stored in the capture memory.

The testing apparatus may further include a logic judging section for judging whether or not a data pattern of the signal-under-test determined by the comparison results stored in the capture memory coincides with a preset expected value pattern.

The strobe timing generator may sequentially generate the strobe signals at a cycle different from that of the signal-under test by a predetermined value.

The testing apparatus may further includes a driver that operates according to a predetermined test rate, for causing the device under test to output the signal-under-test at the cycle according to the test rate. The strobe timing generator may sequentially generate the strobe signals at a cycle larger than the test rate by a predetermined value.

The testing apparatus may further include a logic judging section for judging whether or not a data pattern of the signal-under-test determined by the comparison results stored in the capture memory coincides with a preset expected value pattern.

According to a third aspect of the invention, there is provided a measuring method for measuring a signal-under-test having a predetermined period, having a comparing step of sequentially comparing voltage values of the signal-under-test with a given threshold voltage value at timing of strobe signals sequentially fed thereto, a strobe timing generating step of sequentially generating the strobe signals disposed almost at equal time intervals, a storing step of storing comparison results of the comparator and a digital signal processing step of calculating the jitter of the signal-under-test based on the comparison results stored in the storing step.

According to a fourth aspect of the invention, there is provided a testing method for testing a device-under-test, having a measuring step of measuring jitter of a signal-under-test outputted out of the device-under-test and a jitter judging step of judging whether or not the device-under-test is defect-free based on the jitter measured in the measuring step, wherein the measuring step includes a comparing step of sequentially comparing voltage values of the signal-under-test with a given threshold voltage value at timing of strobe signals sequentially fed, a strobe timing generating step of sequentially generating the strobe signals disposed almost at equal time intervals, a storing step of storing comparison results of the comparator and a digital signal processing step of calculating the jitter of the signal-under-test based on the comparison results stored in the storing step.

According to a fifth aspect of the invention, there is provided a measuring apparatus for measuring a signal-under-test having a predetermined period, having a comparator for sequentially comparing a voltage value of the signal-under-test, a first threshold voltage value and a second threshold voltage value given thereto at timing of strobe signals sequentially given thereto to output comparison results of three values, a capture memory for storing the comparison results of the comparator and a digital signal processing section for calculating jitter of the signal-under-test based on the comparison result stored in the capture memory.

The digital signal processing section may have a Hilbert transformation pair generating section for transforming the comparison result into an analytic signal, an instantaneous phase estimating section for generating an instantaneous phase signal representing an instantaneous phase of the signal-under-test based on the analytic signal and a linear phase removing section for removing a linear phase of the instantaneous phase signal to present phase noise of the signal-under-test.

According to a sixth aspect of the invention, there is provided an electronic device for outputting a signal-under-test, having an operation circuit for generating the signal-under-test and a measuring apparatus for measuring the signal-under-test, and the measuring apparatus has a comparator for sequentially comparing voltage values of the signal-under-test with a threshold voltage value given thereto at timing of strobe signals sequentially given thereto and a capture memory for storing the comparison result of the comparator.

The electronic may further include a strobe timing generator for sequentially generating strobe signals arranged almost at equal time intervals.

The strobe timing generator may sequentially generate the strobe signals at a cycle different from that of the signal-under-test by a predetermined value.

According to a seventh aspect of the invention, there is provided a measuring apparatus for measuring a signal-under-test. The measuring apparatus includes: a first comparator for sequentially comparing voltage values of a first signal-under-test with a threshold voltage value fed thereto at timing of strobe signals sequentially fed thereto at a timing at which the strobe signals are sequentially fed thereto; a second comparator for sequentially comparing voltage values of a second signal-under-test with a threshold voltage value fed thereto at approximately the same time; a strobe timing generator for sequentially generating the strobe signals placed almost at equal time intervals; a capture memory for storing the comparison result of the comparator; and a digital signal processing section for calculating the instantaneous phase for each of the first signal-under-test and the second signal-under-test based on the comparison result stored in the capture memory and calculating a deterministic skew between the first signal-under-test and the second signal-under-test based on each instantaneous phase.

According to an eighth aspect of the invention, there is provided a measuring apparatus for measuring a signal-under-test. The measuring apparatus includes: a first comparator for sequentially comparing voltage values of a first signal-under-test with a threshold voltage value fed thereto at timing of strobe signals sequentially fed thereto at a timing at which the strobe signals sequentially fed thereto; a second comparator for sequentially comparing voltage values of a second signal-under-test with a threshold voltage value fed thereto at approximately the same time; a strobe timing generator for sequentially generating the strobe signals placed almost at equal time intervals; a capture memory for storing the comparison result of the comparator; and a digital signal processing section for calculating the instantaneous phase for each of the first signal-under-test and the second signal-under-test based on the comparison result stored in the capture memory, calculating the instantaneous phase noise for each of the first signal-under-test and the second signal-under-test based on each instantaneous phase and calculating a random skew between the first signal-under-test and the second signal-under-test based on each instantaneous phase noise. Therefore, the timing for each edge of the signal-under-test may be changed within two-three times of the jitter signal around the ideal It is noted that the summary of the invention described above does not necessarily describe all necessary features of the invention. The invention may also be a sub-combination of the features described above.

BRIEF DESCRIPTION OF THE DRAWINGS

FIGS. 5A and 5B are diagrams showing exemplary configurations of a digital signal processing section.

FIG. 7 is a table showing jitter values actually measured by the testing apparatus as compared to jitter values actually measured by a conventional jitter measuring method.

FIG. 22 is a diagram an example of instantaneous phase noise $\Delta\phi(t)$ obtained by sampling a signal-under-test with a strobe signal having a cycle resolution ($\Delta$) from the cycle of the signal-under-test.

FIG. 25 is a diagram showing an example of configuration of a pattern generator 65 included in a testing apparatus 100.

FIG. 26 shows an example of instantaneous phase $\phi(t)$, linear phase and instantaneous phase noise $\Delta\phi(t)$ of the signal-under-test described in FIG. 21.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
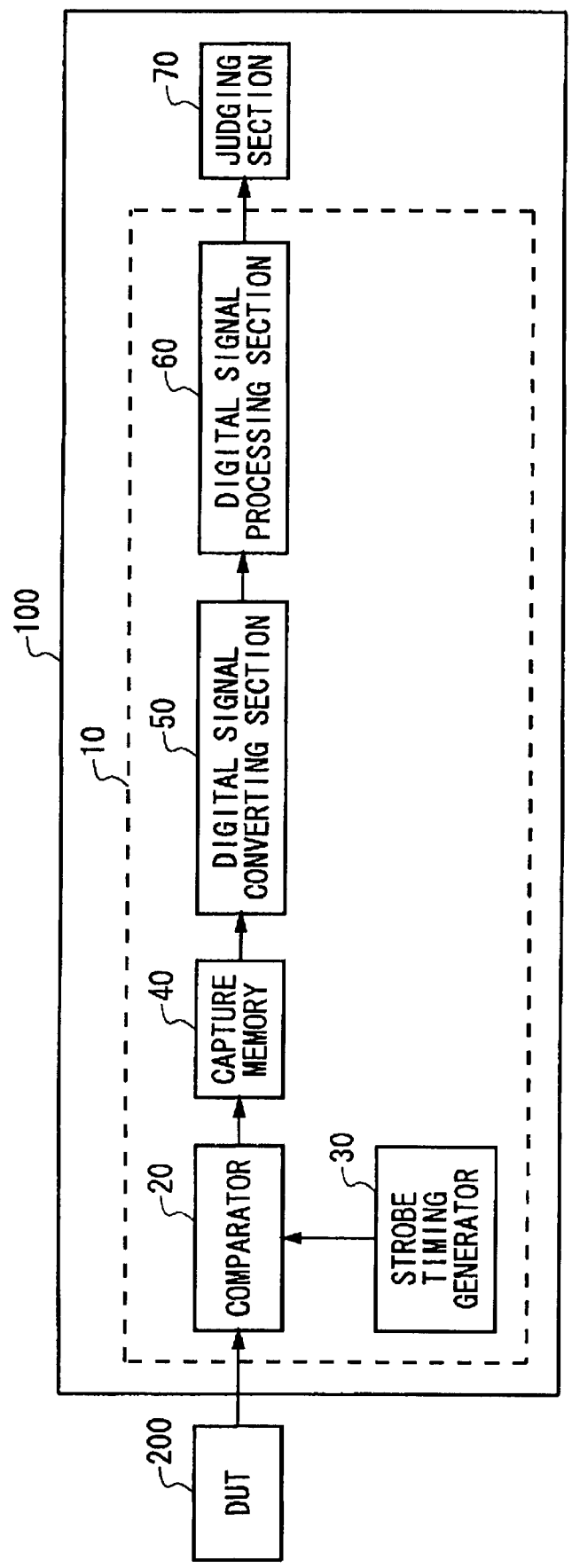
FIG. 1 is a diagram showing one exemplary configuration of a testing apparatus according one embodiment of the invention.

FIG. 1 is a diagram showing one exemplary configuration of a testing apparatus 100 according one embodiment of the invention. The testing apparatus 100 is an apparatus for testing a device-under-test (DUT) 200 such as a semiconductor circuit and has a measuring apparatus 10 and a judging section 70. The measuring apparatus 10 measures jitter in a signal-under-test outputted out of the DUT 200. Here, the signal-under-test is a signal having a predetermined period. The signal-under-test may be a clock signal or a data signal for example. The measuring apparatus 10 may also measure timing jitter of the signal-under-test.

The judging section 70 judges the pass/fail result for the device under test based on the jitter value in the signal-under-test measured by the measuring apparatus 10. For example, the judging section 70 may judge the pass/fail result for the device under test 200 based on whether the value of timing jitter in the signal-under-test is more than a predetermined threshold value. The threshold value may be defined by the specifications of the required device under test 200.

The measuring apparatus 10 has a comparator 20, a strobe timing generator 30, a capture memory 40, a digital signal converting section 50 and a digital signal processing section 60. The comparator 20 compares voltage values of the signal-under-test with a threshold voltage value fed thereto at timing of strobe signals fed sequentially thereto.

The strobe timing generator 30 sequentially generates the strobe signals at almost equally-spaced time intervals. The strobe timing generator 30 may sequentially generate the strobe signals in synchronism with the period of the signal-under-test.

Still more, the strobe timing generator 30 may sequentially generate the strobe signals independently from the period of the signal-under-test. The strobe timing generator 30 may also sequentially generate the strobe signals in synchronism with a period different from the period of the signal-under-test.

The capture memory 40 stores the comparison result outputted out of the comparator 20. For example, the capture memory 40 aligns and stores the comparison results outputted out of the comparator 20 with respect to the phase of the corresponding strobe signals.

The digital signal processing section 60 calculates jitter of the signal-under-test based on the comparison results stored in the capture memory 40. The digital signal processing section 60 may calculate the jitter of the signal-under-test by methods described later in connection with FIGS. 5A and 5B for example. The digital signal processing section 60 may also calculate the jitter of the signal-under-test by means of other known technologies.

It is preferable to input data corresponding to the signal processing method of the digital signal processing section 60 to the digital signal processing section 60. When the digital signal processing section 60 calculates the jitter of the signal-under-test based on zero-crossing points or the like of the signal-under-test for example, it is preferable to input a signal whose absolute value of amplitude presents a discrete value in a range smaller than n (where, n is a real number).

The measuring apparatus 10 of this example converts the comparison results stored in the capture memory 40 into a digital signal to be inputted to the digital signal processing section 60. For example, the digital signal converting section 50 generates the digital signal in which the respective voltage values of the signal-under-test are converted into digital values in a range in which their absolute values are smaller than n (where n is a real number). For example, the digital signal converting section 50 may convert the comparison results into the digital values approximately from 1 to −1.

A case when the comparator 20 compares the voltage values of the signal-under-test with one threshold voltage at timing of the respective strobe signals and outputs a logical value H or logical value L as the comparison result will be explained as an example. For this example, the digital signal converting section 50 outputs a digital signal in which the logic H is converted into a digital value 1 and the logic L is converted into a digital value −1. When the comparator 20 output the comparison results of three values, the digital signal converting section 50 converts the respective comparison results into digital values 1, 0 and −1 corresponding to the logical values of the comparison results.

Such signal conversion facilitates signal processing in the digital signal processing section 60.

Figure 2:
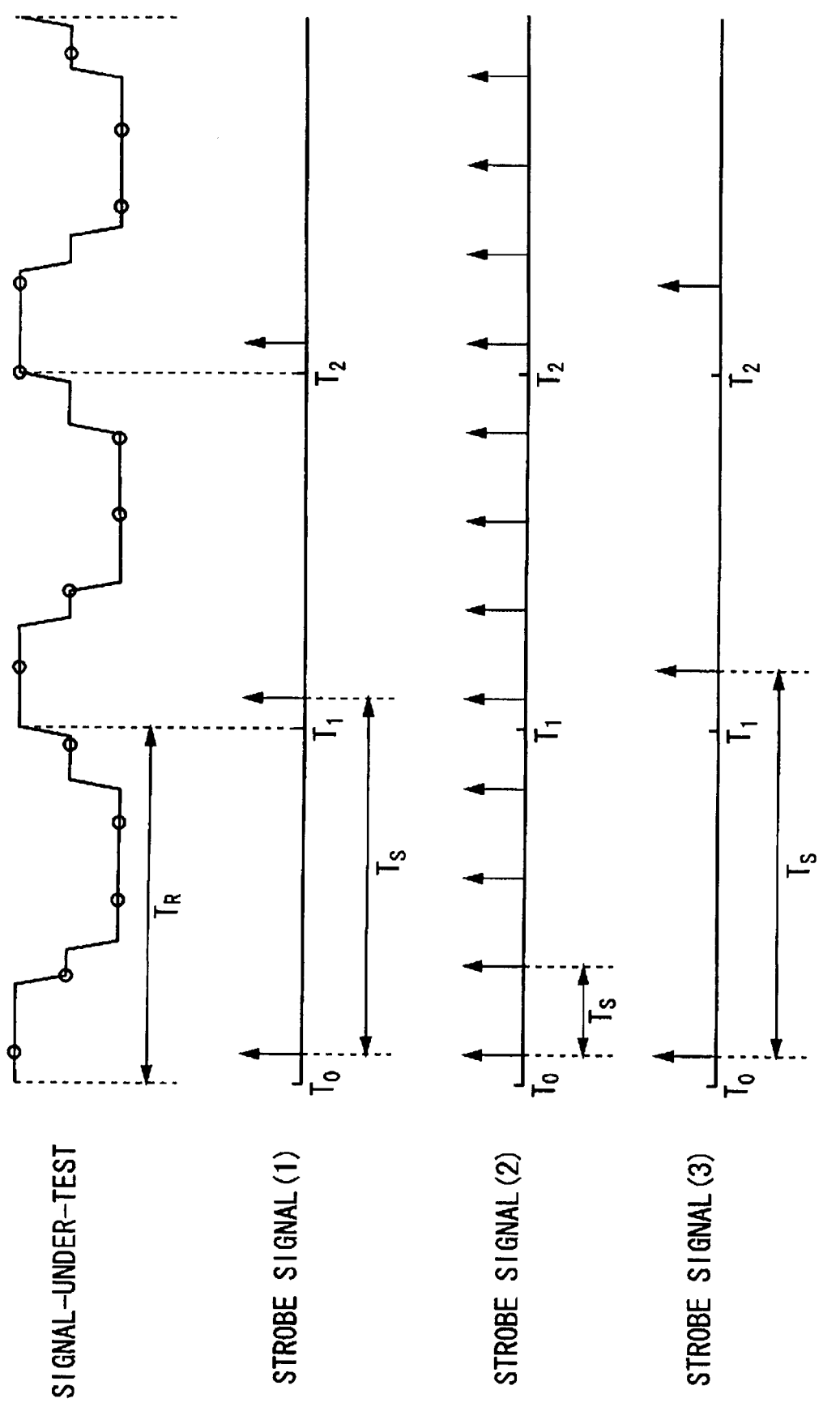
FIG. 2 is a chart showing exemplary strobe signals generated by a strobe timing generator.

FIG. 2 is a chart showing exemplary strobe signals generated by the strobe timing generator 30. This example will be explained by setting the period of the signal-under-test as T.

The strobe timing generator 30 sequentially generates the strobe signals at almost equally-spaced time intervals synchronously or asynchronously with the period T of the signal-under-test as described above.

Generally, the testing apparatus 100 operates per cycle (T0, T1, T2, . . . ) corresponding to operating period (test rate) synchronized with the period T of the signal-under-test. The strobe timing generator 30 may generate one strobe signal or a plurality of strobe signals per cycle corresponding to the test rate as shown by the strobe signals (1) and (2) in FIG. 2. Still more, the strobe timing generator 30 may generate the strobe signals asynchronously from the test rate as shown by the strobe signals (3) in FIG. 2. At this time, a number of strobe signals generated with respect to each cycle is determined by the period and the test rate, by which the strobe timing generator 30 generates the strobe signals. For example, the strobe timing generator 30 may be an oscillation circuit that operates independently from the operation period of the testing apparatus 100.

Still more, the period T of the signal-under-test may or may not coincide with the test rate of the testing apparatus 100. It is preferable for the period T of the signal-under-test to coincide with the test rate when the testing apparatus 100 also performs a functional test described later.

It is possible, by setting the intervals Ts of the strobe signals generated by the strobe timing generator 30 as described above, to sequentially generate strobe signals whose phase is gradually shifted with respect to the phase of the signal-under-test Also, as the strobe signals in which strobes are placed almost at equal time intervals, the strobe timing generator 30 may generate either one of (1) the strobe signals in which one strobe is placed per test rate, (2) the strobe signals in which a plurality of strobes is placed per test rate and (3) the strobe signals in which strobes are placed independently from the test rate.

Although the case in which the test rate of the testing apparatus 100 is equal with the period T of the signal-under-test has been described above, the test rate of the invention is not necessary to be equal to the period T of the signal-under-test when no function test is performed and can be set independently from the period T.

Figure 3A:
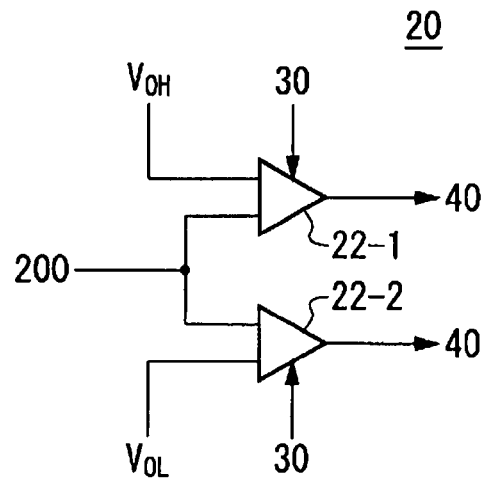
FIGS. 3A, 3B and 3C are diagrams showing exemplary configurations of a comparator.
Figure 3B:
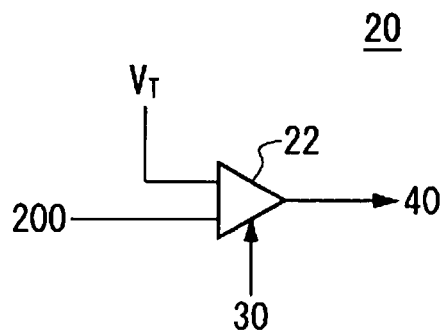
Figure 3C:
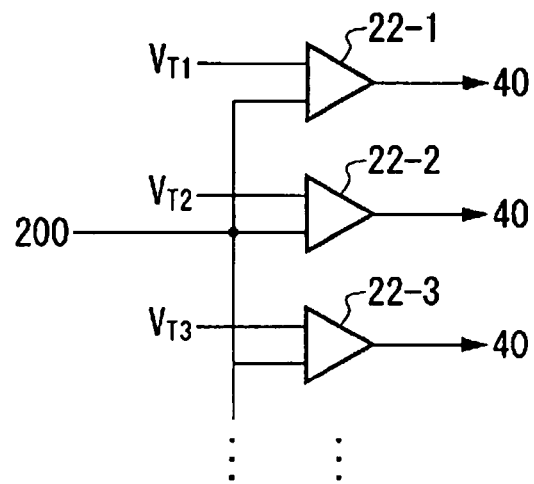

FIGS. 3A, 3B and 3C are diagrams showing exemplary configurations of the comparator 20. The comparator 20 shown in FIG. 3A is supplied with a first threshold voltage VOH and a second threshold voltage VOL and outputs a comparison result of three values. A case when the second threshold voltage VOL is smaller than the first threshold voltage VOH will be explained in this example. The comparator 20 outputs each different comparison result in each case when the voltage value of the signal-under-test is larger than the first threshold voltage VOH, when the voltage value of the signal-under-test is less than the first threshold voltage VOH and is larger than the second threshold voltage VOL and when the voltage value of the signal-under-test is less than the second threshold voltage VOL.

The comparator 20 has a first comparator 22-1 and a second comparator 22-2. The signal-under-test is split into two and fed respectively to the comparators 22-1 and 22-2. The strobe timing generator 30 feeds the strobe signals representing almost same timing to the comparators 22-1 and 22-2.

The first comparator 22-1 compares a voltage value of the signal-under-test with the first threshold voltage VOH per strobe signal fed thereto. The first comparator 22-1 outputs a logical value representing High when the voltage value of the signal-under-test is greater than the first threshold voltage VOH and outputs a logical value representing Low when the voltage value of the signal-under-test is smaller than the first threshold voltage VOH for example.

The second comparator 22-2 compares the voltage value of the signal-under-test with the second threshold voltage VOL per strobe signal fed thereto. The second comparator 22-2 outputs a logical value representing High when the voltage value of the signal-under-test is greater than the second threshold voltage VOL and outputs a logical value representing Low when the voltage value of the signal-under-test is smaller than the second threshold voltage VOL for example.

The comparator 20 outputs a set of the logical values outputted out of the comparators 22-1 and 22-2 as its comparison result. That is, when the logical value outputted out of the first comparator 22-1 is supposed to be M and the logical value outputted out of the second comparator 22-2 is supposed to be N, the comparator 20 outputs the comparison result of three values of (M, N)=(High, High), (Low, High) and (Low, Low) corresponding to the voltage value of the signal-under-test.

In this case, the digital signal converting section 50 converts the respective comparison results (High, High), (Low, High) and (Low, Low) into digital values of 1, 0 and −1, respectively, for example.

The comparator 20 shown in FIG. 3B outputs different comparison results depending on whether or not the voltage value of the signal-under-test is greater than a threshold voltage value VT fed thereto. That is, the comparator 20 of this example outputs the binary comparison results. The comparator 20 has a comparator 22 to which the threshold voltage value VT and the signal-under-test are inputted. The comparator 22 compares the voltage value of the signal-under-test with the threshold voltage value VT at the timings of the strobe signals fed from the strobe timing generator 30. When the voltage value of the signal-under-test is greater than the threshold voltage value VT for example, the comparator 22 outputs the logical value representing High and when the voltage value of the signal-under-test is smaller than the threshold voltage value VT, the comparator 22 outputs the logical value representing Low. The comparator 20 outputs the logical value outputted out of the comparator 22 as a comparison result.

In this case, the digital signal converting section 50 converts the respective comparison results High and Low into digital values of 1 and −1, respectively, for example.

The comparator 20 shown in FIG. 3C has a plurality of comparators 22. Threshold voltages VT1, VT2, . . . different from each other are fed to the respective comparators 22. Still more, the signal-under-test is split and is fed into the respective comparators 22. The strobe timing generator 30 feeds the strobe signals of almost same timing to the respective comparators 22.

The respective comparators 22 compare the voltage value of the signal-under-test with the corresponding threshold voltage VTx at the timings of the strobe signals fed thereto. The operation of each comparator 22 is the same with the comparator 22 shown in FIG. 3B. The comparator 20 outputs sets of the logical values outputted out of the respective comparators 22 as comparison results.

That is, the comparator 20 of this example outputs the comparison results different from each other depending on that the voltage value of the signal-under-test belongs to which one of respective voltage range specified by the neighboring two threshold voltages among the three or more types of threshold voltages VT fed thereto.

For example, the digital signal converting section 50 converts the comparison result in which the logical values outputted out of all of the comparators 22 represent High into a digital value of 1 and converts the comparison result in which the logical values outputted out of all of the comparators 22 represents Low into the digital value of −1. The digital signal converting section 50 also converts the other comparison result into a predetermined digital value between 1 and −1 corresponding its logical value.

Preferably, each threshold voltage fed to the comparator 20 explained in FIGS. 3A through 3C is variable. For example, the measuring apparatus 10 may control each threshold voltage based on information of amplitude level to be measured of the signal-under-test.

Figure 4:
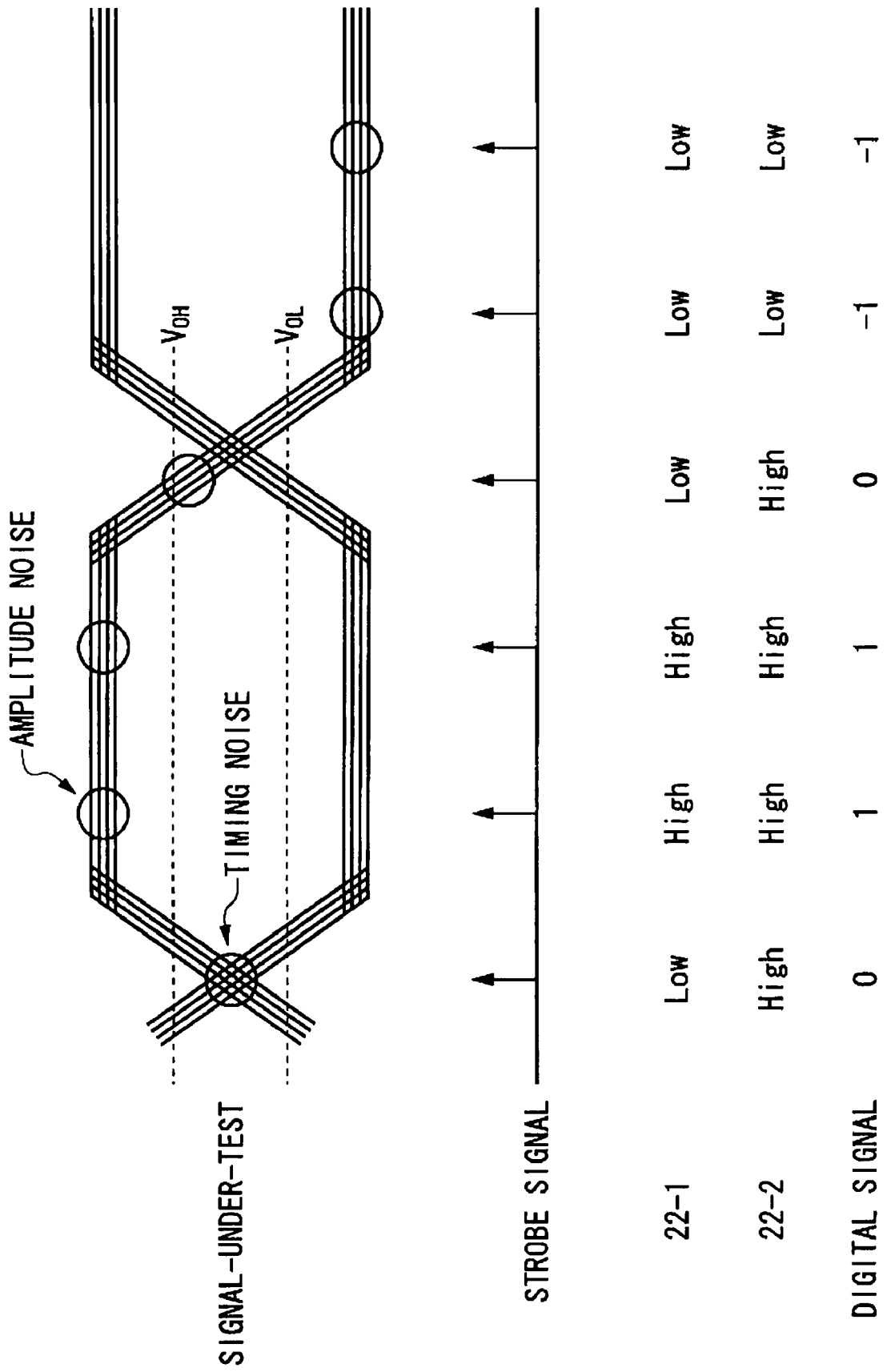
FIG. 4 shows one exemplary operation of the measuring apparatus when the comparator shown in FIG. 3A is used.

FIG. 4 shows one exemplary operation of the measuring apparatus 10 when the comparator 20 shown in FIG. 3A is used. The signal-under-test as illustrated in FIG. 4 is inputted to the measuring apparatus 10. The input signal contains timing noise, i.e., jitter along the time axis, and amplitude noise along the amplitude axis. The jitter of the timing noise is dominant over the edge portions of the signal-under-test and the amplitude noise is dominant over the stationary portions of the signal-under-test.

As shown in FIG. 4, the vertical eye opening of the signal-under-test decreases due to the amplitude noise and the horizontal eye opening thereof decreases due to the timing noise. Ideally, the horizontal eye opening of the signal-under-test is affected only by the timing noise. However, the amplitude noise also affects the horizontal eye opening due to a kind of AM-to-PM conversion. Consequently, the amplitude noise has a relatively high probability of being converted into timing noise.

Then, it is desired to measure timing jitter by removing the influence of the amplitude noise.

However, the measuring apparatus 10 of this example converts the voltage value of the signal-under-test that is greater than the first threshold voltage VOH into the digital value of 1 and converts the voltage value of the signal-under-test smaller than the second threshold voltage VOL into the digital value of −1. Thereby, the influence of the amplitude noise can be removed automatically. Then, the measuring apparatus 10 converts the voltage value of the signal-under-test smaller than the first threshold voltage VOH and greater than the second threshold voltage VOL into the digital value of 0. The timing when those digital values are detected may be determined only by the timing noise. Therefore, it is possible to accurately measure the timing noise by removing the influence of the amplitude noise based on the comparison results of the comparator 20.

Still more, the strobe signals inputted to the comparator 20 are arranged almost at equal intervals independently of the stationary period of the signal-under-test. Therefore, it enables the measurement to be carried out by excluding the time dependency of the timing noise. Preferably, frequency by which the strobe signals are inputted to the comparator 20 is larger than Nyquist frequency. For example, four or more strobe signals may be disposed in each period of the signal-under-test.

FIGS. 5A and 5B are diagrams showing exemplary configurations of the digital signal processing section 60. The digital signal processing section 60 shown in FIG. 5A has a band limiting section 62 and a phase distortion estimating section 64. The band limiting section 62 passes frequency components to be measured of the discrete signal. Still more, the band limiting section 62 of this example converts the discrete signal into an analytic signal. The band limiting section 62 may generate the analytic signal by generating a Hilbert transformation pair.

The digital signal converting section 50 converts the comparison results outputted out of the comparator 20 into the discrete signals representing the digital values of 1, 0 and −1 for example as described above. Therefore, the digital signal converting section 50 can generate a signal corresponding to that discrete signal and may generate an analytic signal cos$(2\pi ft)+j\sin(2\pi ft)$ for example. The influence of the amplitude noise of the signal-under-test has been removed out of the analytic signal as described above.

The phase distortion estimating section 64 calculates phase noise of the discrete signal outputted out of the band limiting section 62. The phase distortion estimating section 64 of this example has an instantaneous phase estimating section 66 and a linear phase removing section 68.

Based on the analytic signal outputted out of the band limiting section 62, the instantaneous phase estimating section 66 generates an instantaneous phase signal presenting instantaneous phase of the discrete signal. The instantaneous phase of the discrete signal may be found from inverse-tangent (arctangent) of the ratio of a real part and an imaginary part of the analytic signal.

The linear phase removing section 68 calculates phase noise of the signal-under-test by removing the linear component of the instantaneous phase signal. For example, the linear phase removing section 68 may calculate the linear component of the instantaneous phase signal based on the period of the signal-under-test or may calculate the linear component in which the instantaneous phase signal is approximated by a straight line. The linear component is the instantaneous phase of the jitter-free signal-under-test. The linear phase removing section 68 may also calculate the linear component based on a measured average period of the signal-under-test. A difference of the instantaneous phase signal with respect to the linear component represents the phase noise of the signal-under-test at each timing.

The digital signal processing section 60 shown in FIG. 5B has a band limiting section 62 and a phase distortion estimating section 64. The band limiting section 62 passes frequency components to be measured of the discrete signal.

The phase distortion estimating section 64 has a zero-crossing timing estimating section 72 and a linear phase removing section 68. The zero-crossing timing estimating section 72 estimates a zero-crossing timing series of the signal-under-test based on the discrete signal outputted out of the band limiting section 62. The zero-crossing timing series is data that sequentially represents timing when the discrete signal presents the digital value "0".

The linear phase removing section 68 removes the linear component of the zero-crossing timing series and calculates the phase noise of the signal-under-test. The linear component may be calculated by the same method performed by the linear phase removing section 68 shown in FIG. 5A.

Figure 6A:
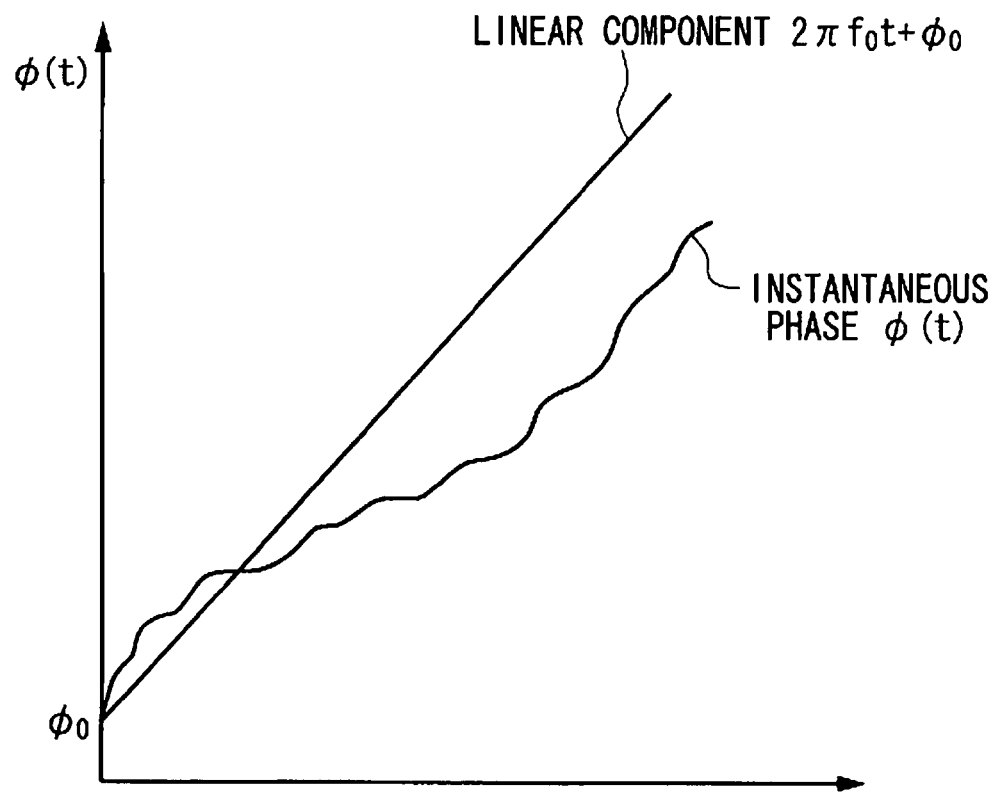
FIGS. 6A and 6B are graphs showing exemplary operations of a linear phase removing section.
Figure 6B:
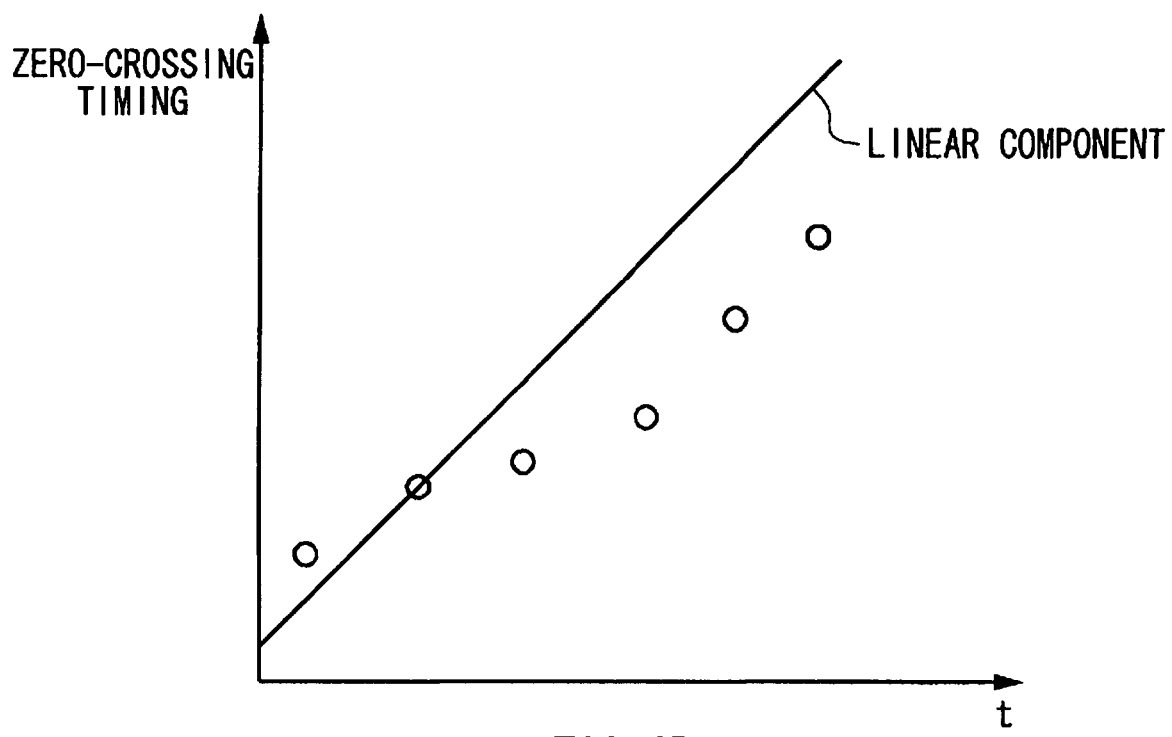

FIGS. 6A and 6B are graphs showing exemplary operations of the linear phase removing section 68. FIG. 6A shows the instantaneous phase of the discrete signal, where an axis of abscissa represents time t and an axis of ordinate represents instantaneous phase $\phi(t)$. It is possible to find the phase error of the discrete signal by finding the difference between the instantaneous phase and its linear component as described above.

FIG. 6B is a graph obtained by plotting each zero-crossing timing, where an axis of abscissa represents time t and an axis of ordinate represents zero-crossing timing. It is then possible to find the phase error of each zero-crossing point, i.e., the phase error of the edge of the signal-under-test, by finding the difference from the linear component at each zero-crossing point as described above.

FIG. 7 is a table showing jitter values actually measured by the testing apparatus 100 as compared to jitter values actually measured by a conventional jitter measuring method. According to the conventional jitter measuring method shown in FIG. 7, an ADC of 8 bits converts the signal-under-test into discrete signals and jitter is measured by the same method as the method used by the digital signal processing section 60. The testing apparatus 100 measures jitter by using the comparator 20 that outputs the digital signals of three values.

As shown in FIG. 7, the testing apparatus 100 that has a simple structure as compared to the conventional method could perform the measurement with less than 4% of measurement error from the conventional method in the both signals-under-measurement having less noise and much noise.

Figure 8A:
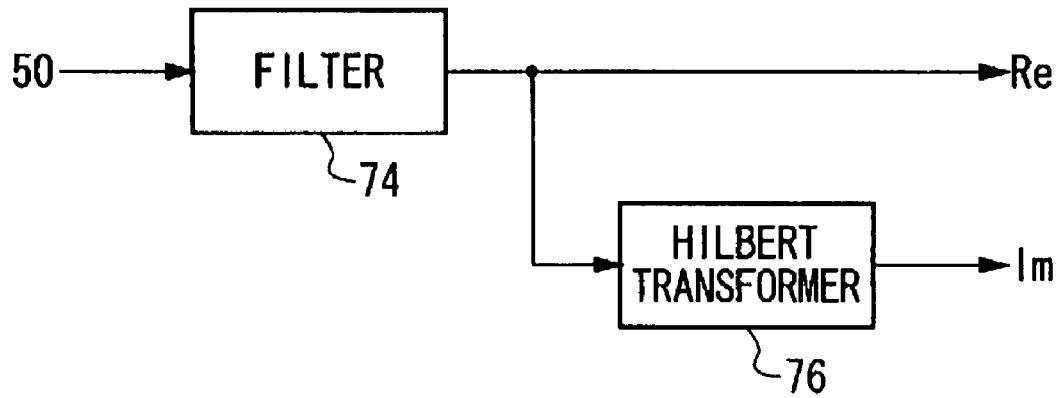
FIGS. 8A and 8B show exemplary configurations of a band limiting section.
Figure 8B:
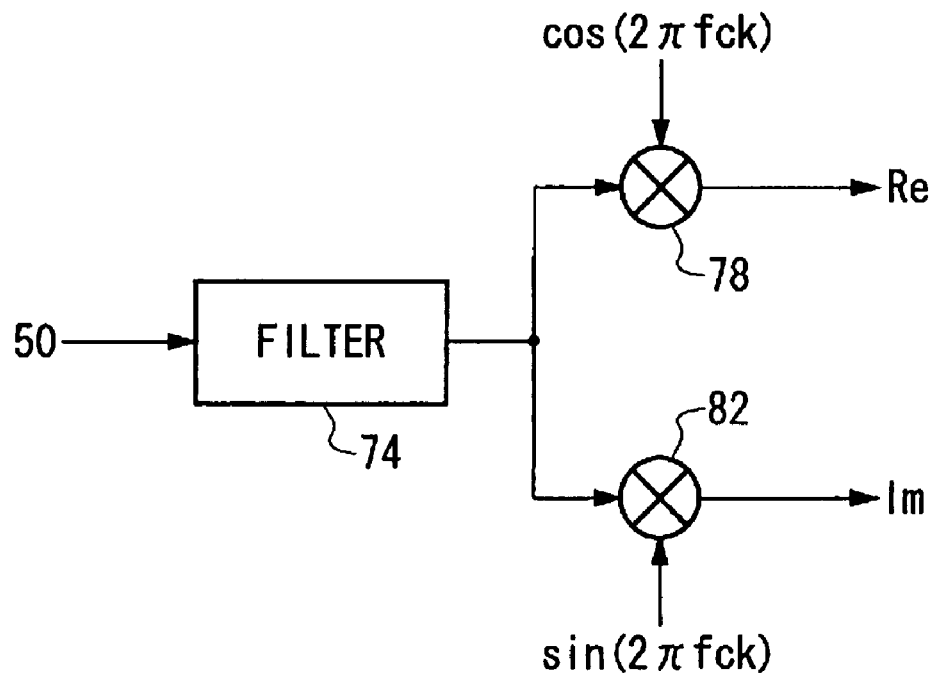

FIGS. 8A and 8B show exemplary configurations of the band limiting section 62. The band limiting section 62 of this example is used in the digital signal processing section 60 shown in FIG. 5A. The band limiting section 62 shown in FIG. 8A has a filter 74 and a Hilbert transformer 76.

The filter 74 provides the discrete signal outputted out of the digital signal converting section 50 and passes frequency components to be measured. The Hilbert transformer 76 performs Hilbert transform on the digital signal outputted out of the filter 74. For example, the Hilbert transformer 76 generates a signal from the digital signal whose phase is delayed by 90 degrees. The band limiting section 62 outputs an analytic signal wherein the digital signal outputted out of the filter 74 is regarded as a real part and the signal outputted out of the Hilbert transformer 76 is regarded as an imaginary part.

The band limiting section 62 shown in FIG. 8B has a filter 74 and mixers 78 and 82. The filter 74 is the same one with the filter 74 shown in FIG. 8A. The mixers 78 and 82 provide the digital signals being split and outputted out of the filter 74, perform quadrature modulation on them and output them. For example, the mixers 78 and 82 provide carrier signals whose phases are different by 90 degrees and output by multiplying the digital signals with the carrier signals. The band limiting section 62 outputs an analytic signal wherein the digital signal outputted out of the mixer 78 is regarded as a real part and the digital signal outputted out of the mixer 82 is regarded as an imaginary part.

The analytic signal having the frequency components to be measured of the signal-under-test may be generated by such configuration.

The filter 74 may pass components around the carrier frequency of the signal-under-test among the frequency components of the signal-under-test or may pass a frequency components of frequency band containing no carrier frequency of the signal-under-test.

Figure 9:
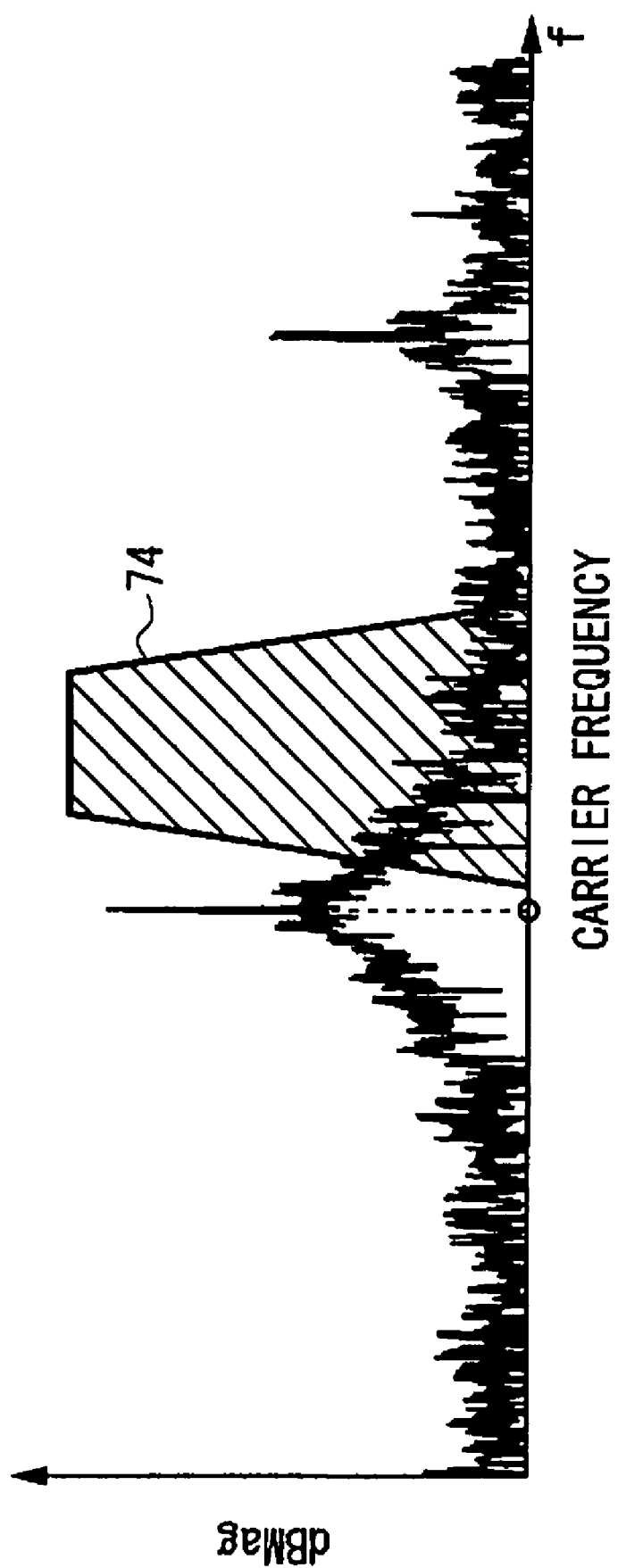
FIG. 9 is a graph showing one exemplary frequency band passed through a filter.

FIG. 9 is a graph showing one exemplary frequency band transmitted through the filter 74. As described above, the filter 74 passes band containing no carrier frequency among the frequency components of the signal-under-test. The carrier frequency component of the signal-under-test is not a noise component and has large energy as compared to the other frequency components. Therefore, when the component of the carrier frequency is not removed, it will be required for the apparatus to provide a measuring range and an arithmetic operation range in which the energy of the carrier frequency may be dominant even though it is an unnecessary component in the measurement of noise. Therefore, it is unable to maintain sufficient resolution in the arithmetic operation and others for noise components that have very small energy as compared to the components of the carrier frequency and hence it is unable to accurately measure the noise component.

As compared to that, the measuring apparatus 10 of this example can accurately measure the noise component because it operates by removing the carrier frequency component of the signal-under-test and by extracting the noise component to be measured. Preferably, the filter 74 removes higher-order harmonic components of the carrier frequency component.

Figure 10:
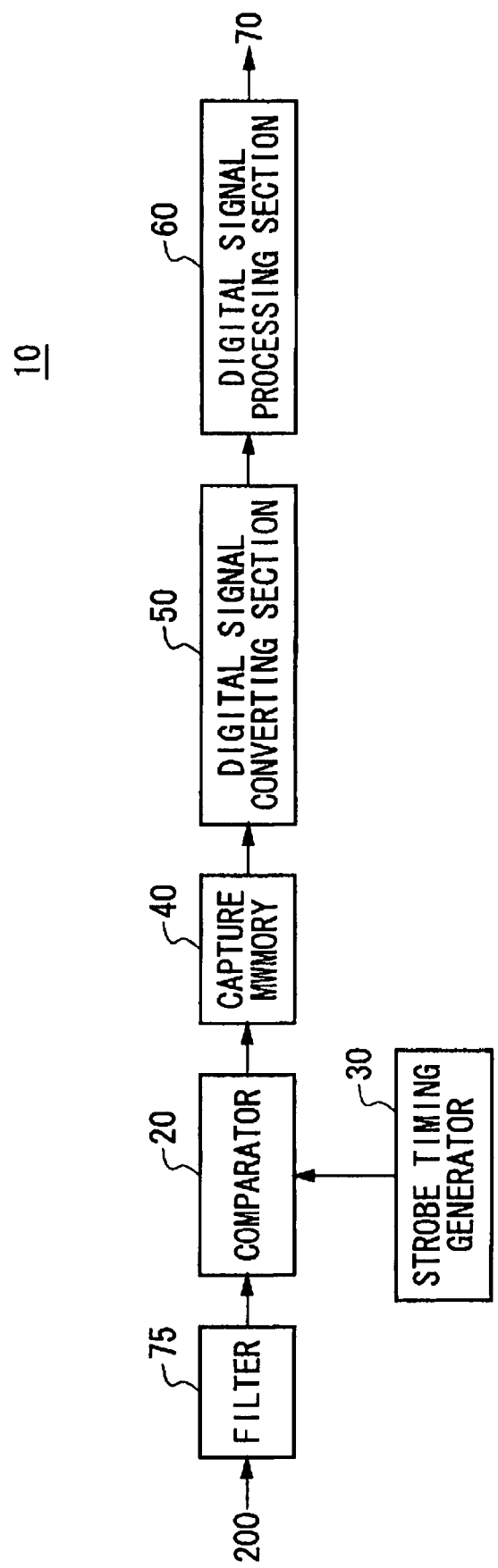
FIG. 10 shows another exemplary configuration of the measuring apparatus.

FIG. 10 shows another exemplary configuration of the measuring apparatus 10. The measuring apparatus 10 further includes a filter 75 in addition to the components of the measuring apparatus 10 shown in connection with FIG. 1. The filter 75 shown in FIG. 10 may have the same function with the filter 74 shown in FIG. 8. The other components have the same or similar functions and configurations with the components denoted by the same reference numerals and explained in FIG. 1.

The filter 75 in this example provides the signal-under-test outputted out of the DUT 200, and passes the frequency components to be measured to input to the comparator 20.

Figure 11:
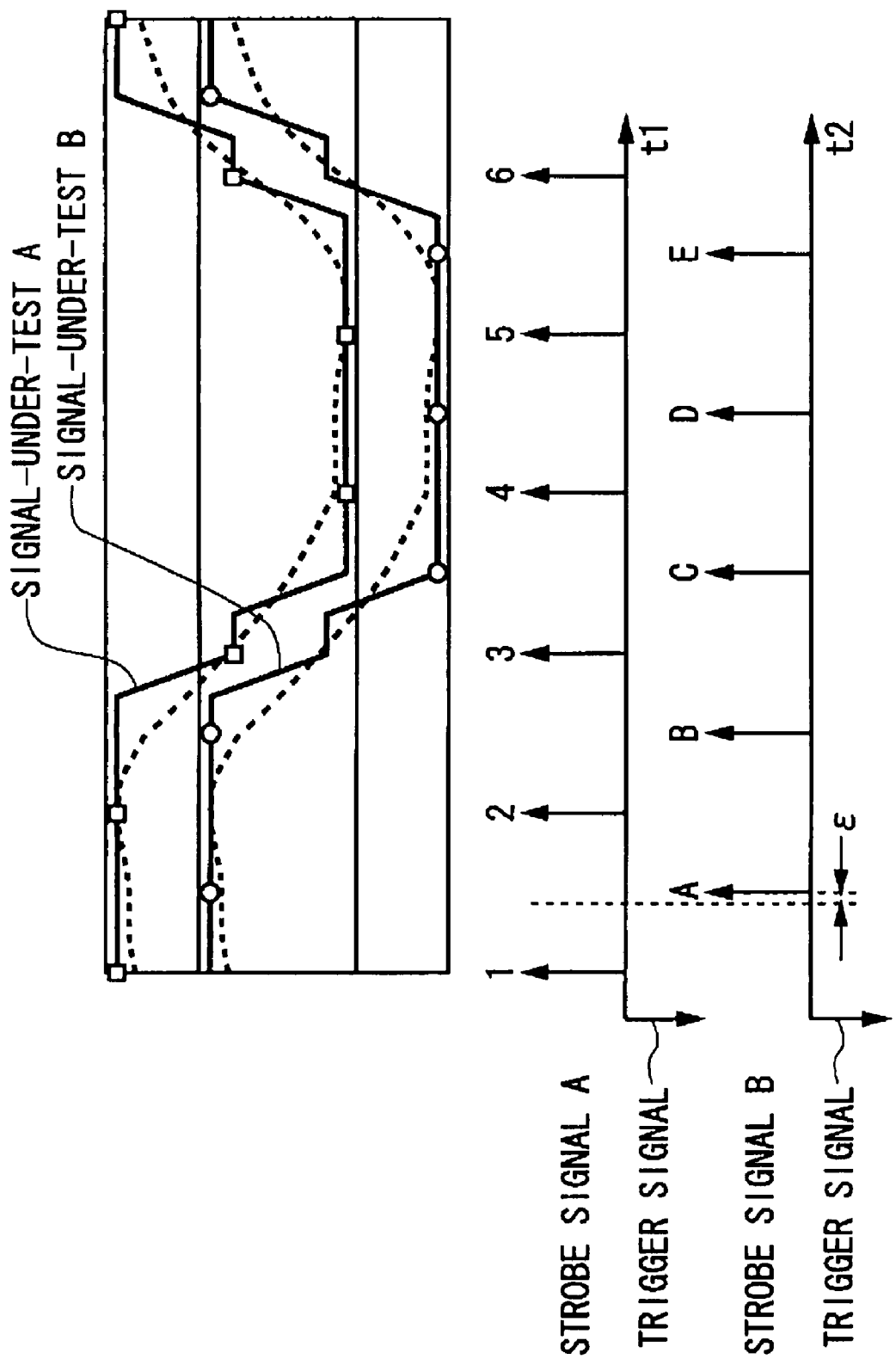
FIG. 11 is a chart showing one exemplary operation of the comparator and the strobe timing generator.

FIG. 11 is a chart showing one exemplary operation of the comparator 20 and the strobe timing generator 30. In this example, the measuring apparatus 10 according to the present embodiment samples the signal-under-test at the frequency of integer multiple of the generated-strobe frequency using the equivalent-time sampling approach by sequentially receiving the signal-under-tests and by shifting the phase of the strobe with respect to the signal-under-test. In the present embodiment, a case that the measuring apparatus 10 receives the sequential repetitions of the same signal-under-tests (a signal-under-test A and a signal-under-test B) twice will be described.

For the signal-under-test A, the strobe timing generator 30 generates a strobe signal A placed almost at equal time intervals synchronously (or asynchronously) with the period or test rate of the signal-under-test at first.

Here, the strobe timing generator 30 generates the strobe signal to be inputted to the comparator 20 based on a phase of a triggering signal synchronized with the signal-under-test. For example, the strobe timing generator 30 starts to output the strobe signal A after an elapse of a predetermined offset time based on the triggering signal having the predetermined phase with respect to the signal-under-test A.

Then, the strobe timing generator 30 starts to output the strobe signal B after an elapse of the predetermined offset time based on the triggering signal in the same manner for the signal-under-test B to be provided after the signal-under-test A. Strobes of the strobe signal B are placed at the same time intervals with the strobe signal A.

Here, the phase of the triggering signal, which is the base timing of the strobe signal A, is almost same with the phase of the triggering signal, which is the base timing of the strobe signal B, and the strobe intervals of the strobe signal A is same with that of the strobe signal B. Still more, the offset time of the strobe signal A to the triggering signal and the offset time of the strobe signal B to the triggering signal may be different by about a half of the strobe interval. That is, when the strobe signal A is overlapped with the strobe signal B, the strobe signals A and B are interleavingly placed almost at equal intervals.

It is then possible, by providing such strobe signals A and B sequentially to a single comparator in order to sample the signal-under-test equivalently at the frequency that is twice the generating frequency of the strobe signal The strobe timing generator 30 may include an oscillation circuit for generating the strobe signal in which strobes are arranged at predetermined time intervals and a delay circuit for delaying the output of the oscillation circuit for example. In this case, the oscillation circuit sequentially generates the strobe signals A and B. Then, the delay circuit sequentially delays the respective strobe signals corresponding to the offsets of the respective strobe signals.

Although this example has been explained by using the strobe signals A and B, the strobe timing generator 30 may sequentially generate many more strobe signals in another example. Equivalent time measurement may be carried out at higher frequency by sequentially changing the offset of those strobe signals.

Figure 12:
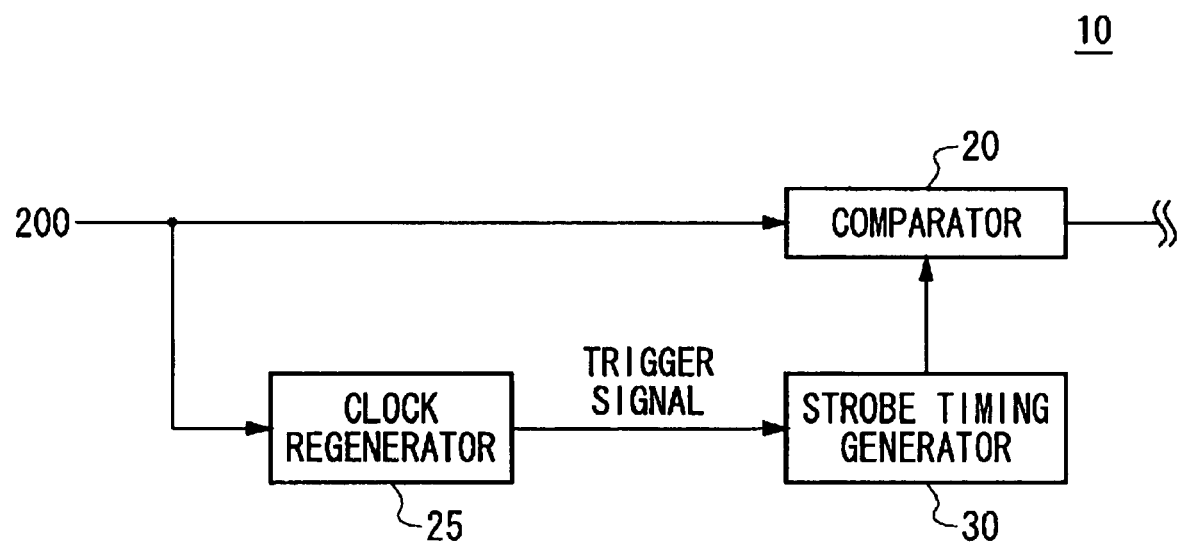
FIG. 12 is a diagram showing another exemplary configuration of the measuring apparatus.

FIG. 12 is a diagram showing another exemplary configuration of the measuring apparatus 10. The measuring apparatus 10 of this example further includes a clock regenerator 25 in addition to the components of the measuring apparatus 10 explained in connection with FIG. 1. The other components are the same with those in the measuring apparatus 10 explained in connection with FIGS. 1 through 11, so that their explanation will be omitted here. Based on the signal-under-test, the clock regenerator 25 generates a recovered clock synchronized with the signal-under-test and inputs the recovered clock as a triggering signal to the strobe timing generator 30. Such configuration allows the timing for starting to generate the strobe signals A and B explained in FIG. 11 to be controlled and the strobe signals A and B having a predetermined phase difference to be generated.

Figure 13:
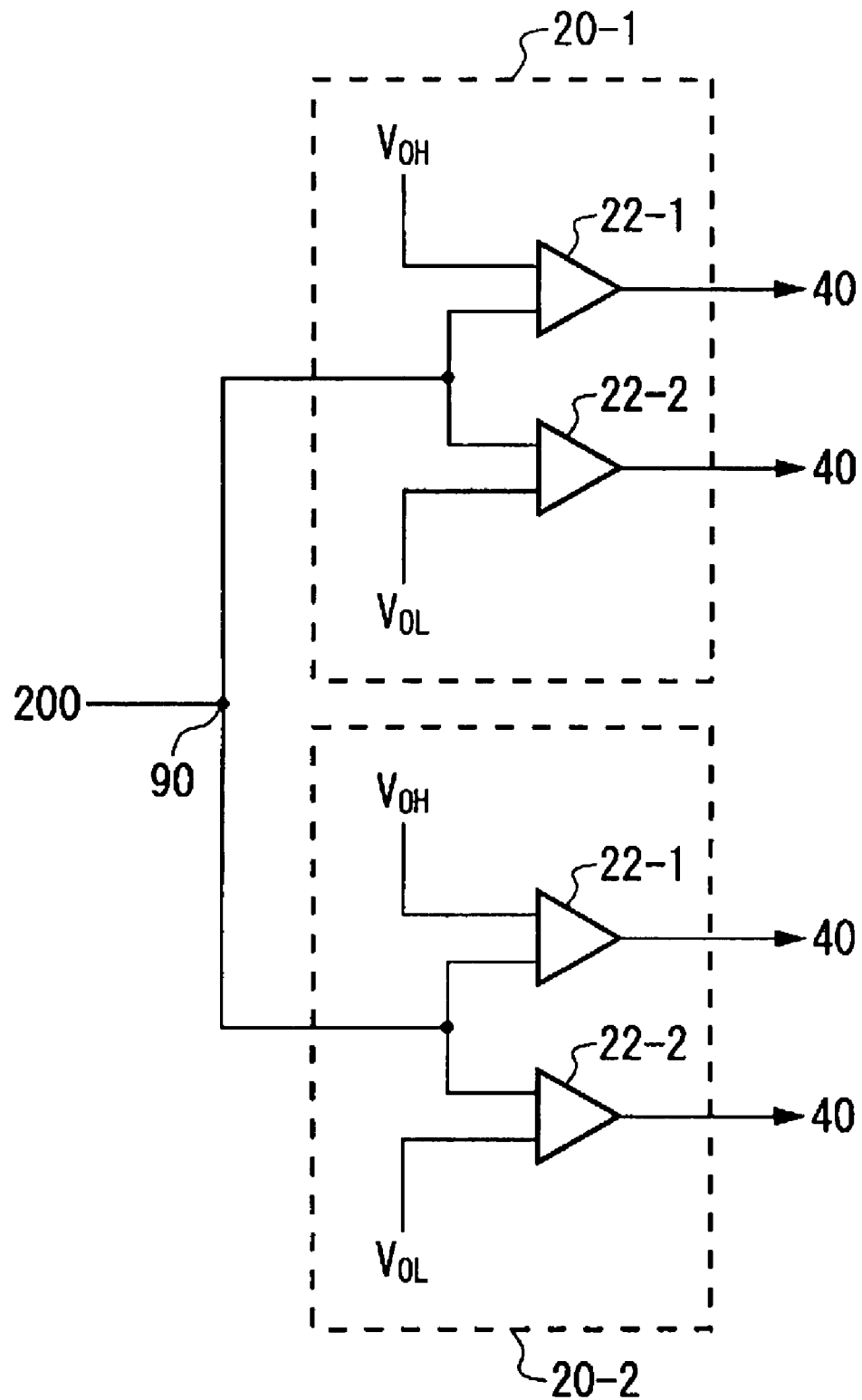
FIG. 13 is a diagram showing another exemplary configuration of the comparator.

FIG. 13 is a diagram showing another exemplary configuration of the comparator 20. The measuring apparatus 10 of this example has two comparators 20-1 and 20-2 (hereinafter denoted generally as 20). Each comparator 20 is the same with the comparator 20 explained in FIG. 3A. Still more, the same first threshold voltage VOH and second threshold voltage VOL are fed to each comparator 20. Further, the signal-under-test is split into two and inputted to the respective comparators 20. The measuring apparatus 10 may further include an inputting section 90 for splitting and inputting the signal-under-test to the respective comparators 20 in parallel. In this case, the strobe timing generator 30 inputs the strobe signals having different phases to the respective comparators. For example, the strobe timing generator 30 inputs the strobe signal A shown in FIG. 11 to the comparator 20-1 and inputs the strobe signal B shown in FIG. 11 to the comparator 20-2. Thereby, interleaving sampling may be carried out by using the two comparators 20 and the signal-under-test may be measured by the frequency by the frequency of twice of the strobe-signal generating frequency.

Figure 14:
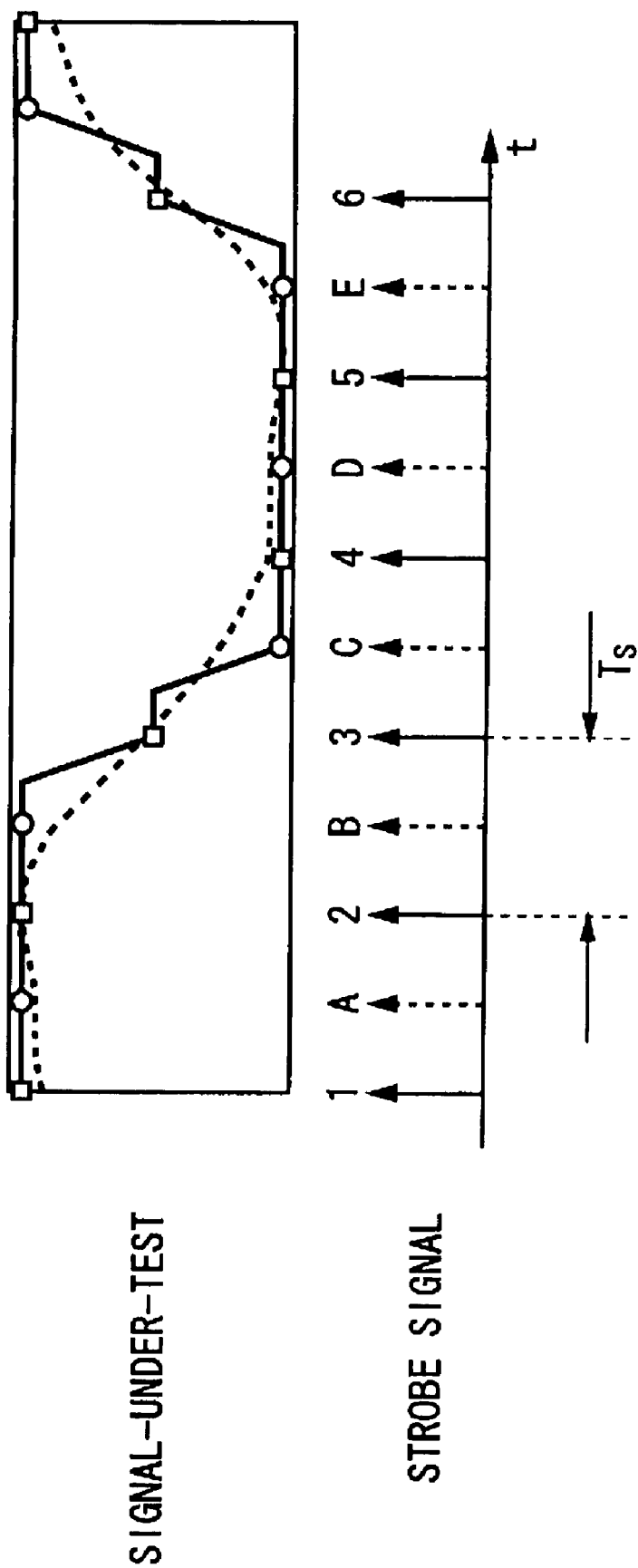
FIG. 14 is a chart showing one exemplary operation of the comparator and the strobe timing generator shown in FIG. 13.

FIG. 14 is a chart showing one exemplary operation of the comparator 20 and the strobe timing generator 30 shown in FIG. 13. The strobe timing generator 30 generates the strobe signal A (1, 2, 3, . . . ) and the strobe signal B (A, B, C, . . . ) and inputs them to the respective comparators 20.

The capture memory 40 aligns and stores the comparison results of the two comparators 20 corresponding to the phase of the corresponding strobe signals. For example, the capture memory 40 sequentially aligns and stores the comparison results corresponding to the strobe 1, strobe A, strobe 2, strobe B, . . . shown in FIG. 14. The strobe signals A and B are generated in the same time in such a case, so that it is not necessary to generate the respective strobe signals based on the triggering signal. It will do if a strobe groups in which the strobe signals A and B are superimposed are arranged almost at same time intervals. For example, the strobe timing generator 30 may have a circuit for generating the strobe signal A and a circuit for generating the strobe signal B by delaying the strobe signal A.

Still more, although the case of having the two comparators 20 has been explained in this example, the measuring apparatus 10 may have more comparators 20. In this case, it is possible to measure higher frequency by changing the offset of the strobe signals to be inputted to the respective comparators 20.

However, the sampling method explained in connection with FIGS. 11 through 14 may cause an error in the measured result if the phase of either one strobe signal is erroneous with respect to preset phase. Therefore, it is preferable to correct the phase error of the strobe signal, i.e., the measurement error based on the error of the sampling timing.

Figure 15:
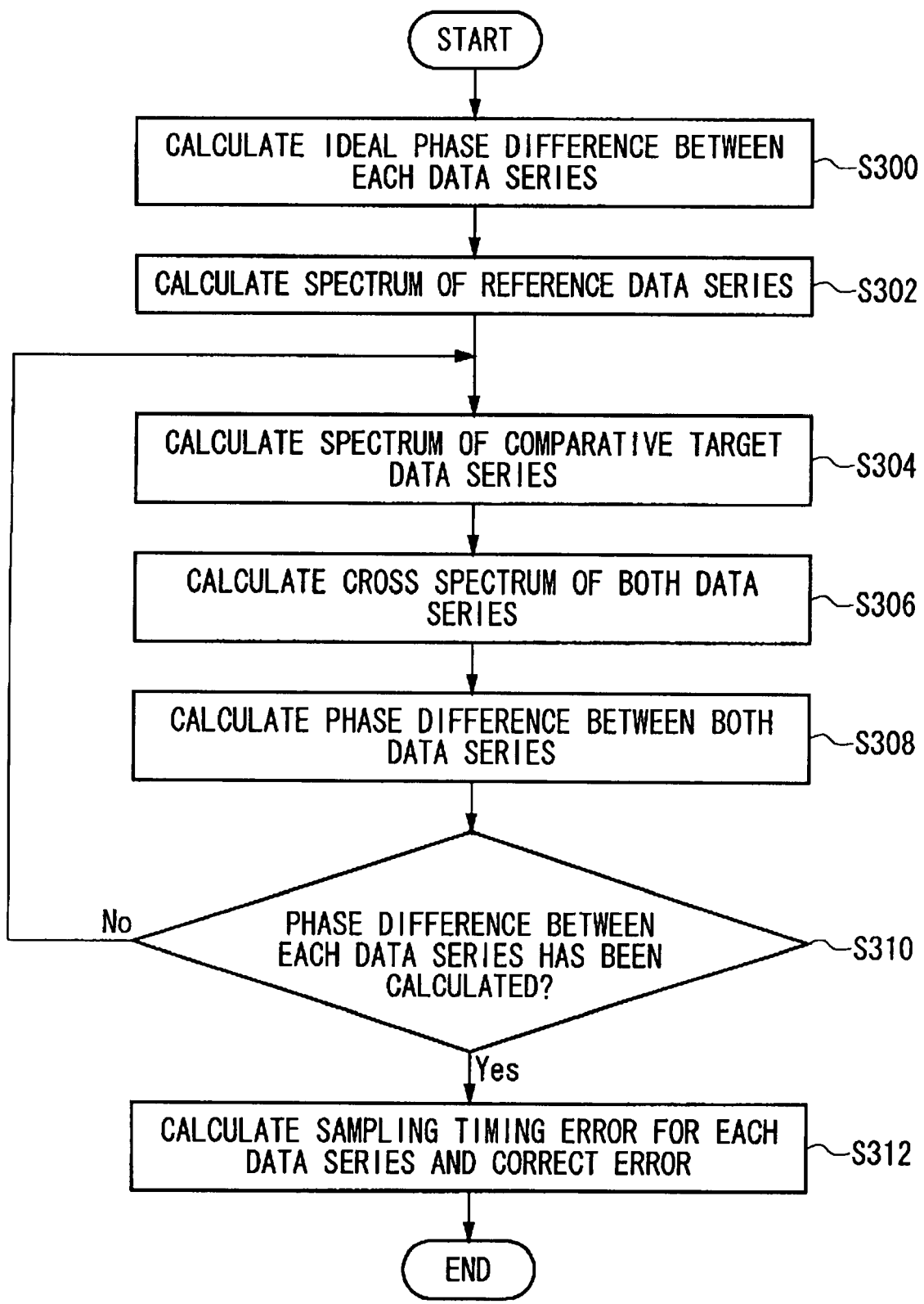
FIGS. 15 and 16 are flowcharts showing one exemplary method for correcting errors of sampling timing.
Figure 16:
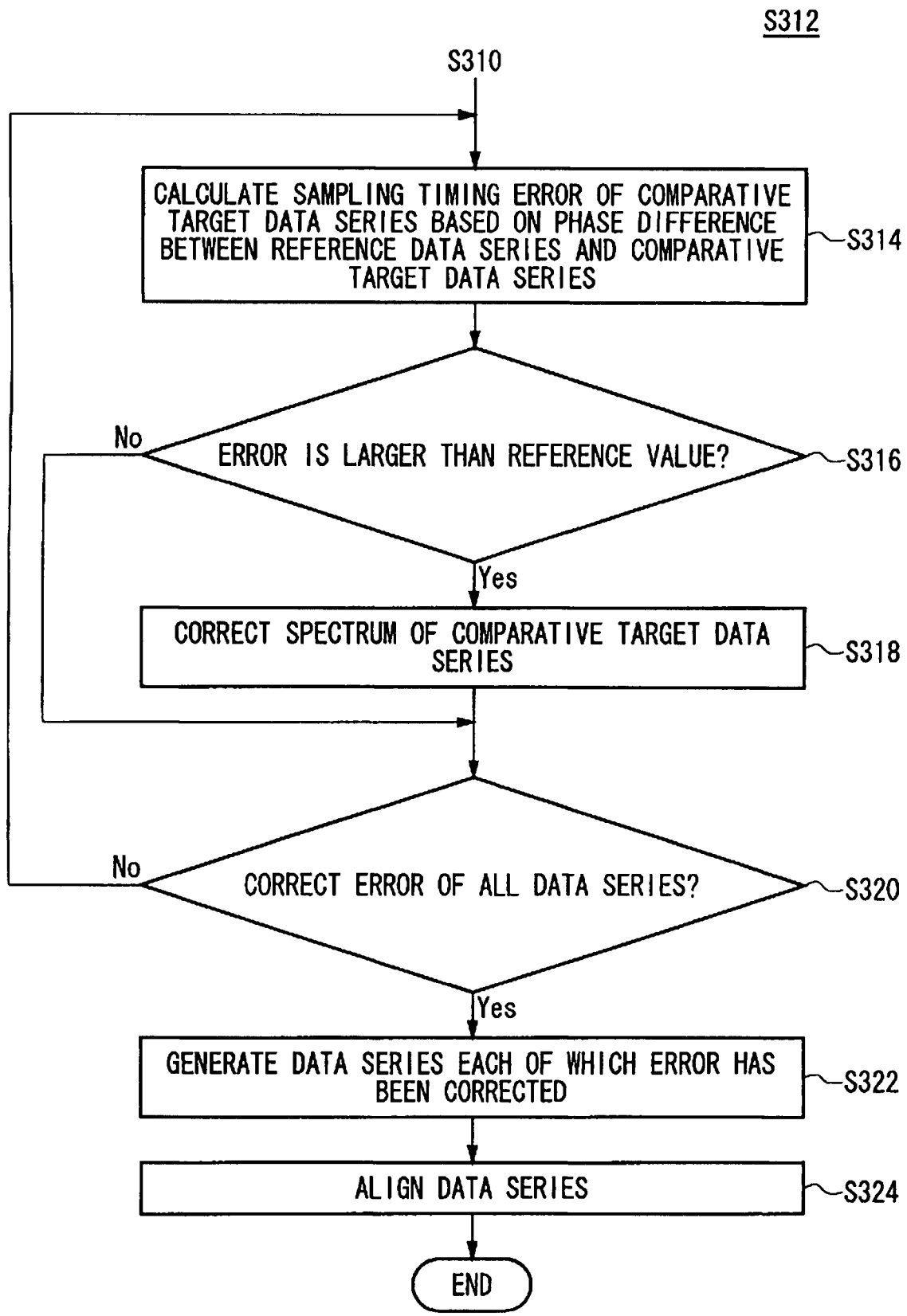

FIGS. 15 and 16 are flowcharts showing one exemplary method for correcting errors of the sampling timing. This correction may be carried out by the digital signal processing section 60. At first, the digital signal processing section 60 calculates an ideal value of phase difference of the sampling timing of the respective data series sampled corresponding to the respective strobe signals in an ideal phase difference calculating step S300. For example, the phase difference may be given by $2\pi(\Delta t/T)$, where the ideal value of the difference of the offset of the respective strobe signals is $\Delta t$ and the average period of the signal-under-test is T.

Next, the digital signal processing section 60 selects an arbitrary data series as a reference among the plurality of data series and calculates a spectrum of the data series in a reference spectrum calculating step S302. That spectrum may be obtained by performing a fast Fourier transform on the data series.

Next, the digital signal processing section 60 selects a data series other than the reference data series and calculates a spectrum of that data series in a comparative spectrum calculating step S304. That spectrum may be also obtained by performing a fast Fourier transform.

Next, the digital signal processing section 60 calculates a cross-spectrum of the spectrum of the reference data series and that of the data series for comparison in a cross-spectrum calculating step S306. This cross-spectrum may be obtained by complex multiplication of complex conjugate spectrum of the spectrum of the reference data series and the spectrum of the data series for comparison.

Next, the digital signal processing section 60 calculates a phase difference between the reference data series and the data series for comparison in a phase difference calculating step S308. This phase difference may be calculated based on the cross-spectrum calculated in Step S306. That is, a phase component of the cross-spectrum represents the phase difference of the reference data series and the data series for comparison.

Although the phase difference has been calculated by using the cross-spectrum of the two data series in Steps S304 and S306, the phase difference may be calculated by another method. For example, the digital signal processing section 60 may calculate the phase difference based on cross-correlation function of the two data series.

Next, it is judged in Step S310 whether or not the digital signal processing section 60 has calculated the phase difference for all of the data series to be compared. When there exists data series whose phase difference from the reference data series is not calculated, the digital signal processing section 60 repeats the processes in Steps 304 through 308 for that data series.

When the digital signal processing section 60 has calculated the phase difference for all of the data series to be compared, the digital signal processing section 60 corrects the measurement error based on the phase difference of the respective data series for comparison in an error correcting step S312. For example, the digital signal processing section 60 corrects the respective data series based on the difference of the phase difference of each data series for comparison from the ideal phase difference found in Step 300.

FIG. 16 is a flowchart showing one exemplary process in the error correcting step S312. At first, the digital signal processing section 60 calculates the sampling timing error of the data series for comparison based on the phase difference between the reference data series and the data series for comparison in a timing error calculating step S314. The timing error may be calculated based on the ideal phase difference.

Next, the digital signal processing section 60 judges whether or not the timing error is greater than a predetermined threshold value in a comparing step S316. When the timing error is smaller than the threshold value, the digital signal processing section 60 moves to the process in Step S320 without correcting the corresponding data series. When the timing error is greater than the threshold value, the digital signal processing section 60 corrects the corresponding data series in a correcting step S318. For example, the digital signal processing section 60 may correct the data series by shifting the phase of spectrum of that data series based on the timing error.

Next, the digital signal processing section 60 judges whether or not the timing error has been corrected for all of the data series. When there exists data series whose timing error has not been corrected, the digital signal processing section 60 repeats the processes from Step S314 to Step S318 to that data series. When the correction of the timing error has been carried out for all of the data series, the digital signal processing section 60 generates the data series whose timing errors have been corrected respectively in a data series generating step S322. For example, it is possible to obtain the data series whose timing error has been corrected by performing an inverse fast Fourier transform on the spectrum of each data series whose timing error has been corrected.

Then, the digital signal processing section 60 aligns the respective data series in an aligning step S324. For example, the digital signal processing section 60 aligns the respective data corresponding to sampling timing of respective data.

The measurement error caused by the error of sampling timing may be corrected through such processes. Thereby, jitter may be measured more accurately.

Figure 17:
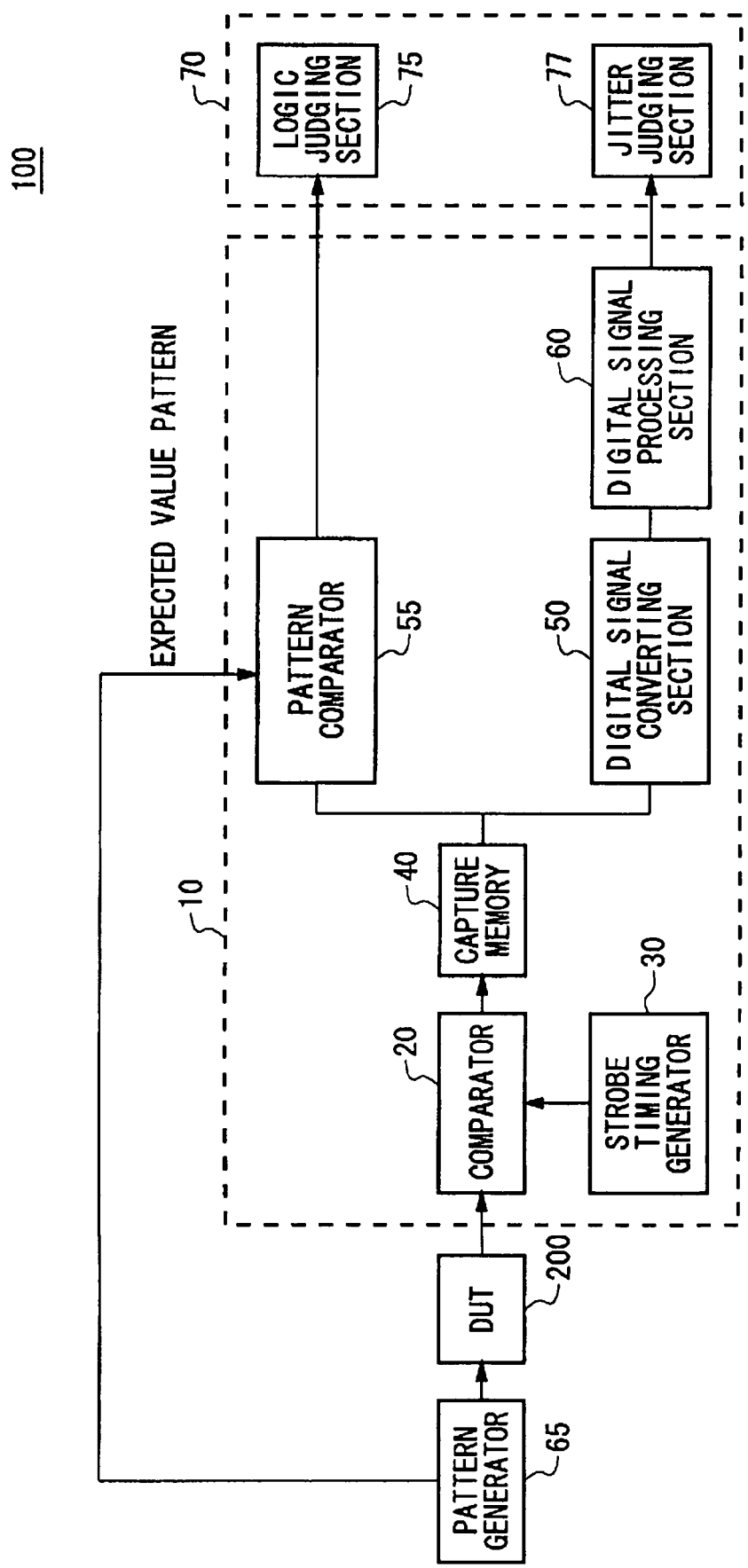
FIG. 17 is a diagram showing another exemplary configuration of the testing apparatus.

FIG. 17 is a diagram showing another exemplary configuration of the testing apparatus 100. The testing apparatus 100 of the present embodiment further includes a function for performing a function test of the DUT 200 in addition to the function for performing the jitter test by the testing apparatus 100 explained in connection with FIGS. 1 through 16.

In addition to the components of the testing apparatus 100 explained in connection with FIGS. 1 through 16, the testing apparatus 100 of this embodiment further includes a pattern generator 65 and a pattern comparing section 55. Still more, the judging section 70 has a logic judging section 75 and a jitter judging section 77. The other components have the same or similar functions and configurations with the components denoted by the same reference numerals and explained in FIGS. 1 through 16.

In performing the functional test of the DUT, the pattern generator 65 inputs a test signal having a predetermined data pattern to the DUT 200. The comparator 20 detects a data pattern of the signal-under-test by comparing a voltage value of a signal-under-test outputted out of the DUT 200 with a predetermined threshold voltage at timing of given strobe signals.

While the strobe timing generator 30 generates the strobe signals at this time, the strobe timing generator 30 generates the strobe signals corresponding to a test rate synchronized with a period of the signal-under-test in performing the functional test. For example, the strobe timing generator 30 generates one strobe signal at almost-center timing of each test rate. Thereby, the comparator 20 detects a data value in each period of the signal-under-test.

The strobe timing generator 30 may generate the strobe signals independent of the test rate in performing the jitter test as described above. The strobe timing generator 30 has the oscillation circuit for generating the strobe signals for example, and the operation of the oscillation circuit may be controlled by the test rate in performing the functional test and it is not necessary to be controlled by the test rate in performing the jitter test. Still more, the strobe timing generator 30 may have a first oscillation circuit for generating the strobe signals in performing the functional test and a second oscillation circuit for generating the strobe signals in performing the jitter test. At this time, the operation of the first oscillation circuit is controlled by the test rate and the second oscillation circuit is operated independently of the test rate.

In performing the functional test, the pattern comparing section 55 compares the data pattern of the signal-under-test given by the comparison results stored in the capture memory 40 whether or not it coincides with a preset expected value pattern. The pattern generator 65 may generate the expected value pattern based on the data pattern of the test signal.

The logic judging section 75 judges whether or not the DUT 200 is defect-free based on the comparison result in the pattern comparing section 55.

The digital signal converting section 50, the digital signal processing section 60 and the judging section 70 may be a computer with an embedded software. In this case, the testing apparatus 100 can perform the jitter test by using the conventional testing apparatus for testing functions without adding any hardware. Therefore, the test of the DUT 200 may be performed at low cost.

Figure 18:
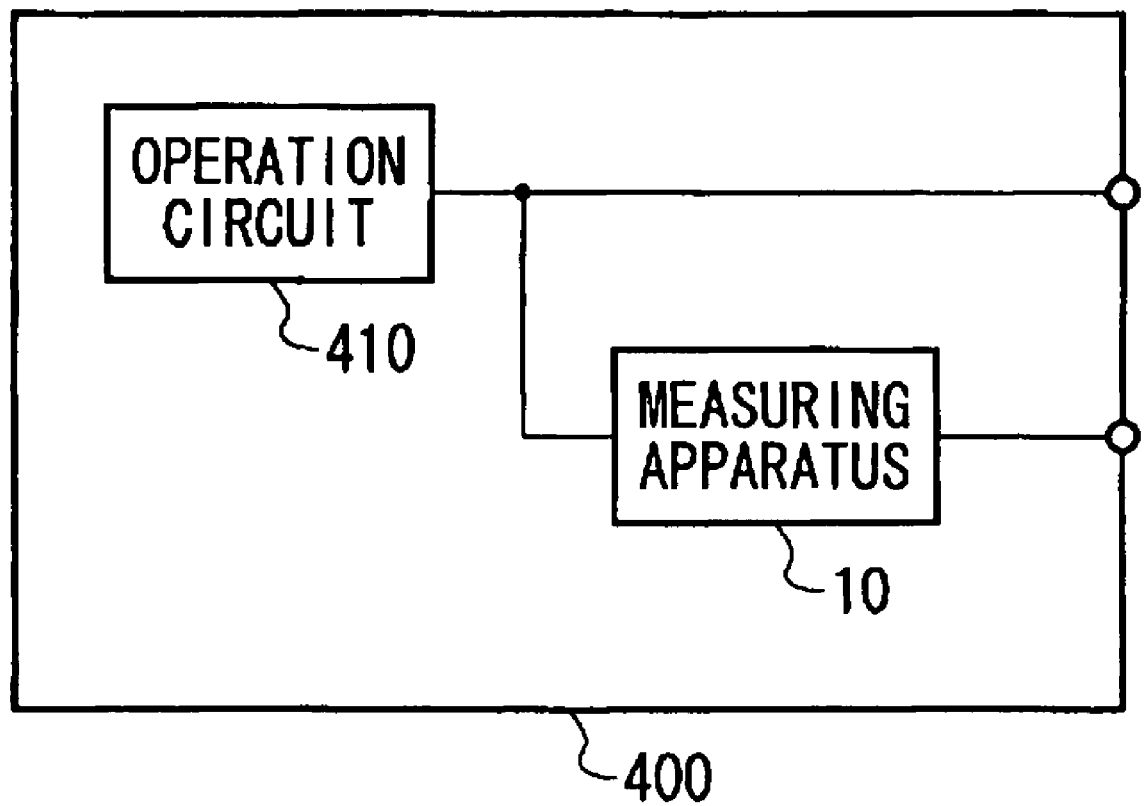
FIG. 18 is a diagram showing one exemplary configuration of an electronic device according to another embodiment of the invention.

FIG. 18 is a diagram showing one exemplary configuration of an electronic device 400 according to another embodiment of the invention. The electronic device 400 has an operation circuit 410 for generating the signal-under-test and the measuring apparatus 10. The electronic device 400 may have a part of the configuration of the operation circuit 410 and the measuring apparatus 10 within a package formed of such as resin and ceramic.

The operation circuit 410 operates corresponding to an external signal inputted from the outside for example and outputs the signal-under-test. The measuring apparatus 10 measures the signal-under-test outputted out of the operation circuit 410.

The measuring apparatus 10 may have a structure similar to that of the measuring apparatus 10 explained in connection with FIGS. 1 through 16. For example, the measuring apparatus 10 may have the comparator 20 and the capture memory 40. In this case, the comparator 20 is provided the strobe signals explained in connection with FIGS. 1 through 16. The strobe signals may be given from the outside or may be generated within the electronic device 400.

It is preferable for the electronic device 400 to also have the strobe timing generator 30 when the strobe signals are to be generated within the electronic device 400. As explained in connection with FIGS. 1 through 16, the capture memory 40 stores the measurement results obtained by sampling the signal-under-test equivalently at high frequency.

Therefore, it is possible to accurately measure jitter in the electronic device 400 by accessing the comparison results stored in the capture memory 40. At this time, the external apparatus is not required to measure the high-speed signal-under-test, so that its equipment cost can be reduced.

Figure 19:
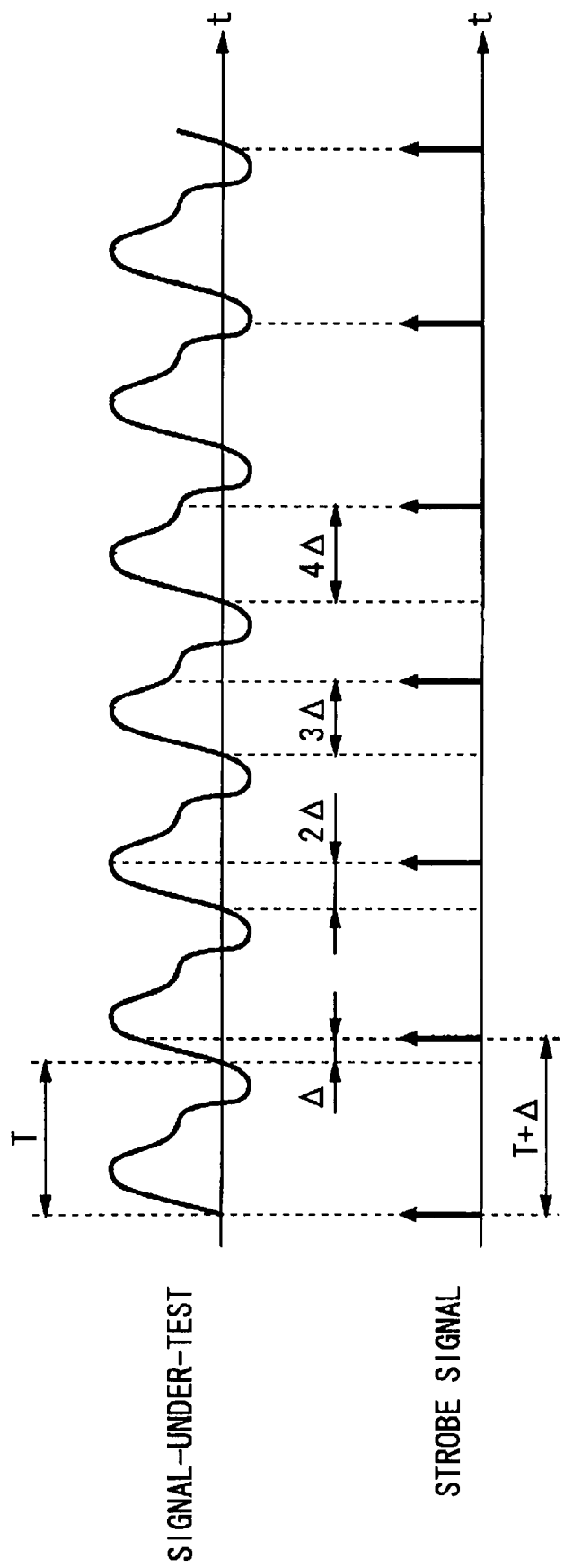
FIG. 19 is a diagram showing a strobe signal generated by the strobe timing generator 30.

FIG. 19 is a diagram showing a strobe signal generated by the strobe timing generator 30. The strobe timing generator 30 according to the present embodiment may used for either of the measuring apparatus in FIG. 1 and the measuring apparatus in FIG. 10. The strobe timing generator 30 according to the present embodiment sequentially generates strobe signals at a period (T+Δ) different from a period (T) by a predetermined value (Δ). That is to say, the strobe timing generator 30 generates strobe signals of which phase relative to that of the signal-under-test is gradually changed. The signal-under-test according to the present embodiment is a signal indicative of approximately the same waveform at the cycle (T).

Additionally, the strobe timing generator 30 according to the present embodiment may generate a strobe signal at a cycle which does not satisfy Nyquist theorem for the signal-under-test. That is, the strobe timing generator 30 according to the present embodiment undersamples the signal-under-test. For example, the strobe timing generator 30 generates a strobe signal at a cycle larger than half of that of the signal-under-test. In the present embodiment, the strobe timing generator 30 generates strobe signals at a cycle larger than that of the signal-under-test at even intervals as shown in FIG. 19.

As described above, by gradually changing the relative phase between the strobe and the repetitive signal-under-test, the signal-under-test can be equivalently sampled at high frequency.

For example, when the cycle of the signal-under-test is 400 ps and the cycle of the strobe signal is 405 ps, the phase of the strobe signal relative to the signal-under-test is changed by 5 ps per cycle. The waveform for each cycle of the signal-under-test is approximately the same, so that the signal-under-test can be equivalently sampled at the cycle of 5 ps.

The capture memory 40 may store the comparison result outputted by the comparator 20 according to the strobe signal in chronological order. The digital signal converting section 50 retrieves the comparison result of the predetermined number of points among the comparison results stored in the capture memory, convert the same to digital signals and input the same in the digital signal processing section 60.

For example, from the capture memory 40, the digital signal converting section 50 may retrieve the comparison results with the total number of samples, which is determined by satisfying the restriction of corresponding to the integer number of cycles of the signal-under-test. That is, the digital signal converting section 50 may obtain the division result by calculating (the period of the signal-under-test)/(the difference between the period of the strobe and the period of the signal-under-test), and retrieve data with the integer multiple of the division result from the comparison results being continuously stored in the capture memory 40.

As described above, when the cycle of the signal-under-test is 400 ps and the cycle of the strobe signal is 405 ps, the number of points of the comparison result corresponding to one cycle of the signal-under-test is 160. In this case, the digital signal converting section 50 may retrieve the comparison result with the number of points which is integer multiple of 160 as a discrete waveform from the capture memory 40. Therefore, a processing such as a Fourier Transform can be performed without multiplying the discrete waveform by a window function such as a Hanning window. Accordingly, a measurement with a high frequency resolution can be achieved in comparison with the case that the window function is used. Additionally, the measurement time can be minimized. The discrete signal converting section 50 may retrieve the maximum number of points of the comparison result corresponding to integer multiple cycles of the signal-under-test within the number of points of the comparison result stored in the capture memory.

Figure 20A:
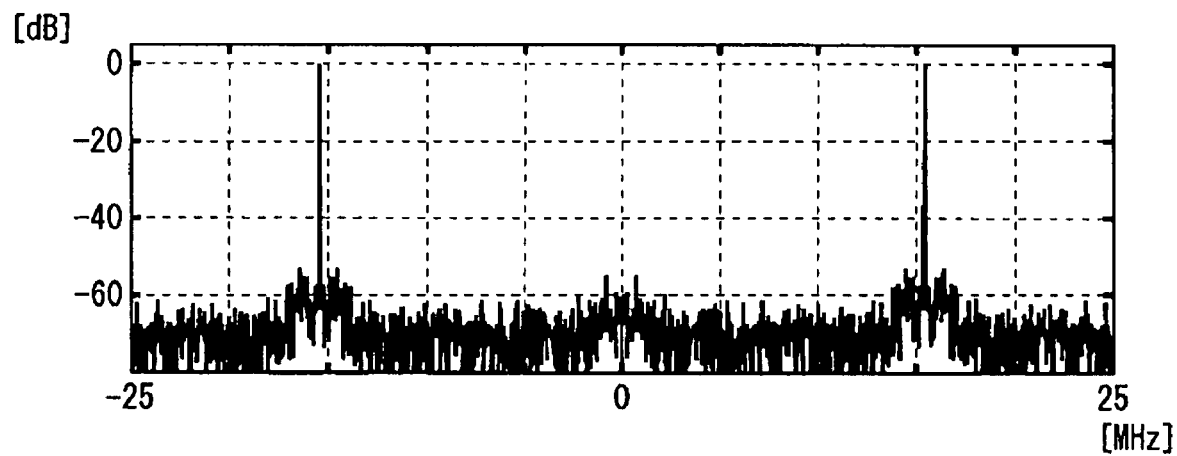
FIG. 20 is a diagram explaining an example of operation of the digital signal processing section 60.

Each of FIG. 20 and FIG. 21 is a diagrams explaining an example of operation of the digital signal processing section 60. The digital signal processing section 60 performs a Fourier Transform on the digital signal inputted from the digital signal converting section 50 to convert the same to a signal in the frequency domain. FIG. 20A shows an example of digital signal in the frequency domain.

At this time, when the number of points of data inputted from the digital signal converting section 50 is power-of-two, the digital signal processing section 60 may perform a Fast Fourier Transform on the retrieved data. Alternatively, when the number of points of data inputted from the digital signal converting section 50 is not power-of-two, the digital signal processing section 60 may perform a Fourier Transform on the retrieved data with the mixed-radix algorithm. For example, when the number of points of data is power-of two, i.e. the radix is only two, the digital signal processing section 60 may perform a one-dimensional Fast Fourier Transform. Additionally, when the number of points of data is indicated by the product of a plurality of radixes or the mixed radix, the digital data processing section 60 may calculate by performing the mixed-radix FFT, the prime factor FFT or the split-radix FFT dependent on the number of points of the radix.

Figure 20B:
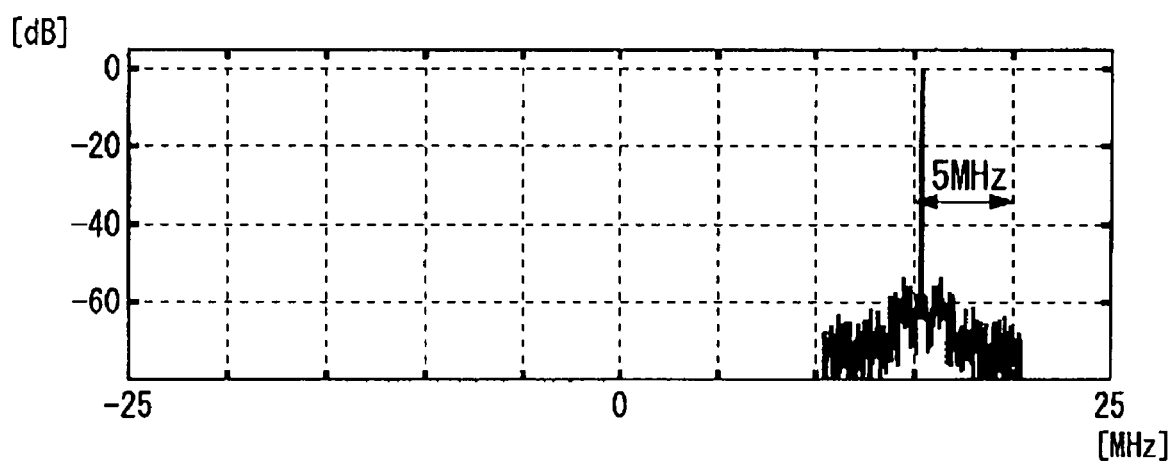

Next, the digital signal processing section 60 extracts the frequency component around the carrier frequency of the signal-under-test. FIG. 20B shows an example of extracted frequency component. FIG. 20B shows an example of frequency component extracted when the carrier frequency of the signal-under-test is about 16 MHz, and the cut off frequency is about 15 MHz+−5 MHz.

Figure 21A:
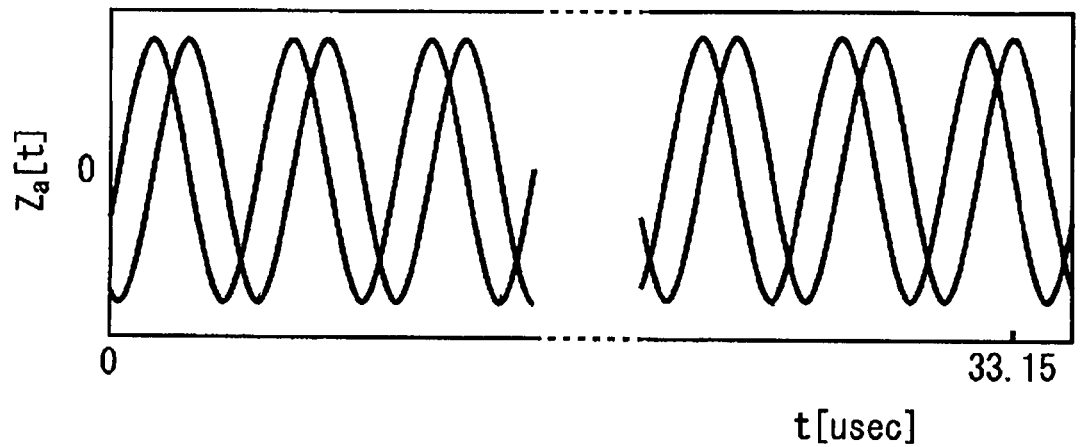
FIG. 21 is a diagram explaining an example of operation of the digital signal processing section 60.

Next, the digital signal processing section 60 performs an inverse Fourier Transform on the extracted frequency components to convert the same to a signal in the time domain. FIG. 21A shows an example of signal in the time domain. By such processing, the analytic signal of the signal-under-test can be obtained.

Figure 21B:
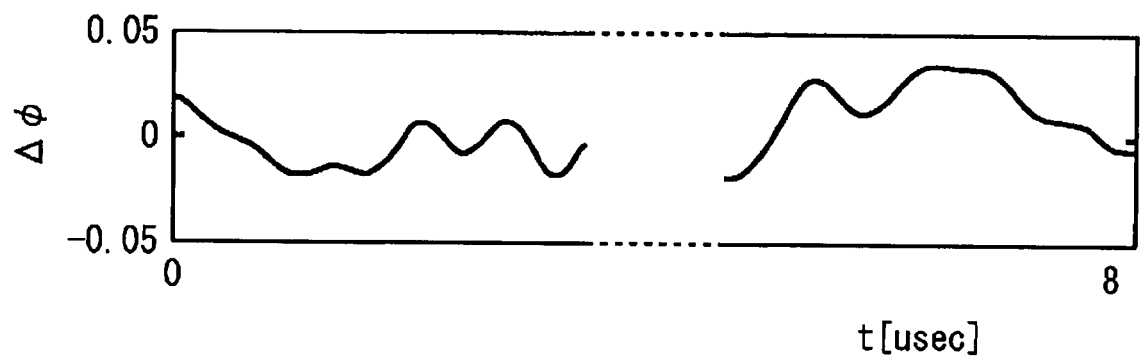

Next, the digital signal processing section 60 calculates the instantaneous phase $\phi(t)$ of the signal-under-test based on the analytic signal. Additionally, the digital signal processing section 60 calculates the instantaneous phase noise $\Delta\phi(t)$ of the signal-under-test by removing the linear component from the instantaneous phase. The method of calculating the instantaneous phase noise $\Delta\phi(t)$ from the instantaneous phase $\phi(t)$ is the same as the method shown in FIG. 6A. FIG. 21B shows an example of calculated instantaneous phase noise $\Delta\phi(t)$.

As described with reference to FIG. 6B, the digital signal processing section 60 can calculate jitter of the signal-under-test based on the calculated instantaneous phase noise $\Delta\phi(t)$. Here, the accuracy of the calculated instantaneous phase noise $\Delta\phi(t)$ is changed depending on the difference between the cycle of the signal-under-test and that of the strobe signal, i.e. the time resolution.

FIG. 22 shows an example of instantaneous phase noise $\Delta\phi(t)$ calculated when the cycle resolution (Δ) between the cycle of the signal-under-test and that of the strobe signal is changed. In the present embodiment, the instantaneous phase noise for each of the cycle resolution (Δ) of the cycle 5 ps, 10 ps, 20 ps, and 40 ps is indicated. When the cycle resolution (Δ) is changed as shown in FIG. 22, the waveform of the calculated instantaneous phase noise is changed. Therefore, it is preferred that the cycle resolution (Δ) of the cycles is selected as a value smaller than the jitter value of the signal-under-test, the standard deviation and the rms value.

Figure 23:
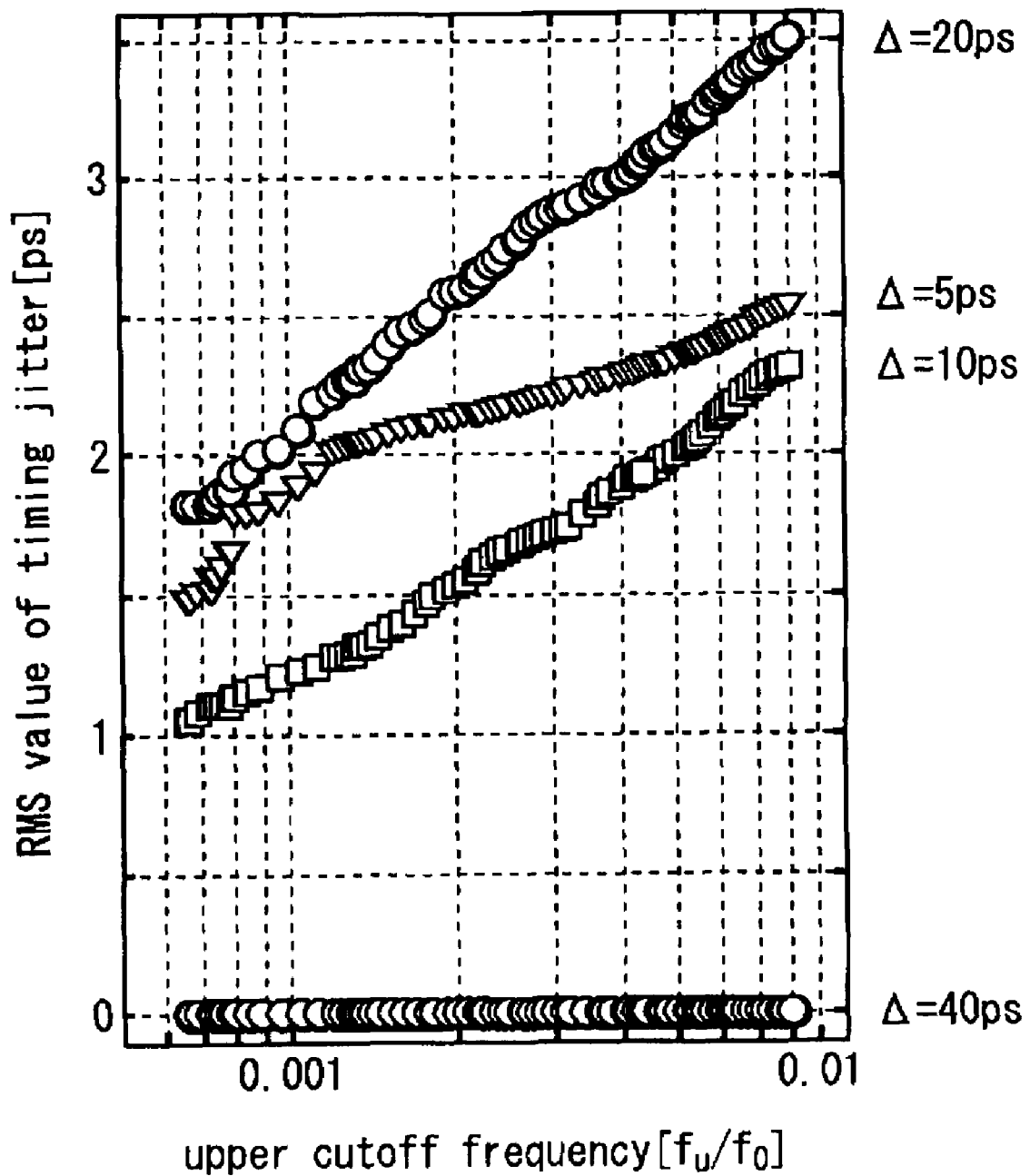
FIG. 23 is a diagram illustrating the measuring bandwidth dependency of the jitter value calculated for each cycle resolution ($\Delta$).

FIG. 23 is a diagram illustrating the measurement band width dependency of the jitter value calculated for the cycle resolution (Δ). The jitter value according to the present embodiment is calculated for the cycle resolution (Δ) when the rms value of the jitter variation included in the signal-under-test is 2 ps. Here, the horizontal axis in FIG. 23 is corresponded to the cut off frequency shown in FIG. 23.

Figure 24:
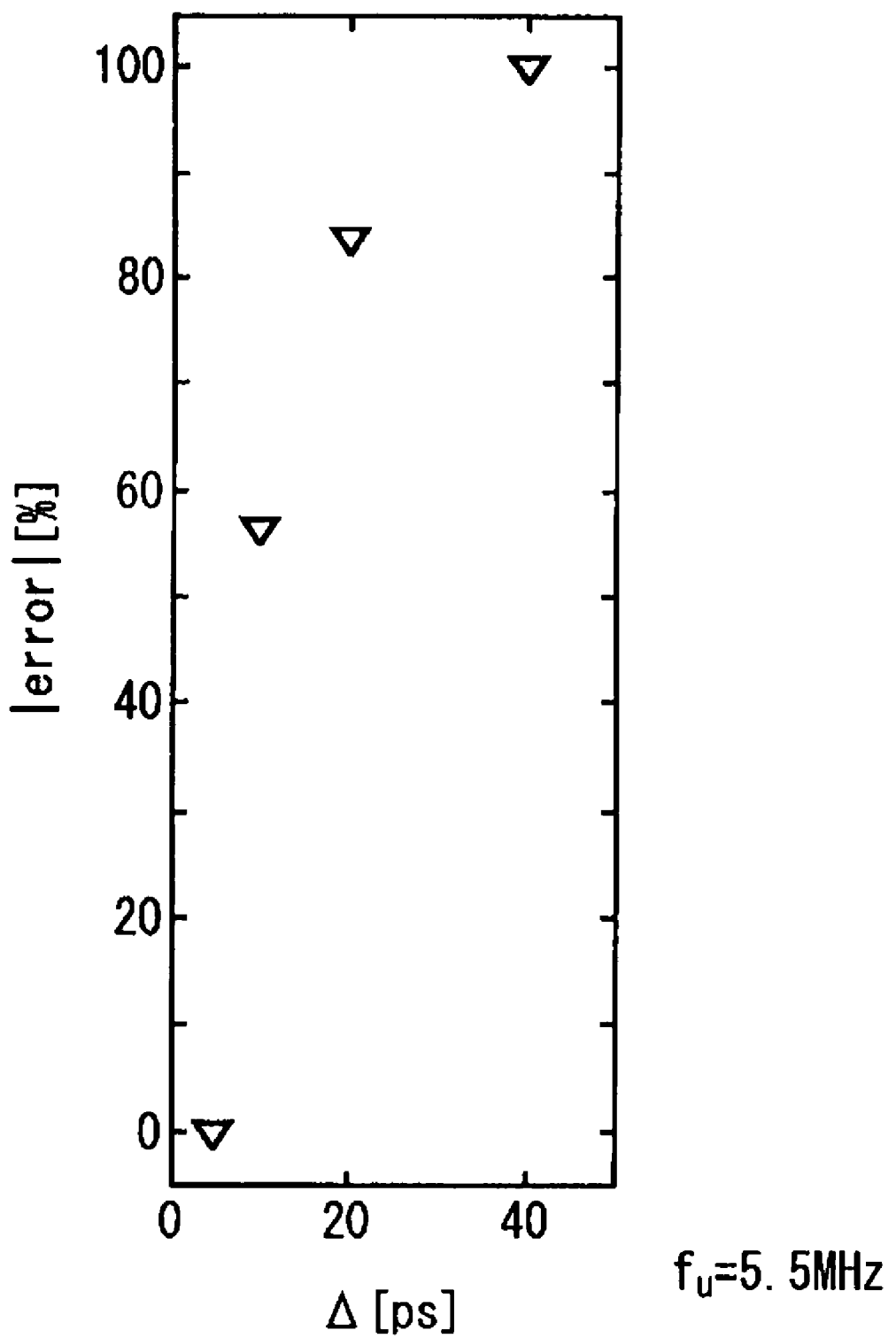
FIG. 24 is a diagram showing an example of measurement error of the jitter value calculated for the cycle resolution ($\Delta$) between each cycle.

FIG. 24 is a diagram showing an example of measurement error of the jitter value calculated for the cycle resolution (Δ) between each cycle. In the present example, the measurement value when the cycle resolution (Δ) is 5 ps is the true value.

As shown in FIG. 23 and FIG. 24, as the cycle resolution (Δ) is increased, the measurement error of the jitter value is rapidly increased.

The strobe timing generator 30 may set the cycle of the strobe signal so as to more reduce the cycle resolution (Δ). For example, when a plural kinds of cycles can be selected as cycles of the strobe signal in the strobe timing generator 30, the strobe timing generator 30 may select a cycle for which the cycle resolution (Δ) is more reduced.

Additionally, the strobe timing generator 30 may set the cycle of the strobe signal such that the difference between the cycle of the strobe signal and that of the signal-under-test is a value dependent on the amplitude of jitter to be measured or the time resolution for calculating jitter. For example, if the amplitude value of the jitter to be measured or the value of the time resolution of the jitter to be calculated is provided, the strobe timing generator 30 may sequentially set the cycle resolution of the strobe signals as being less than three times of the rms value of jitter or the value of the time resolution. Here, the jitter value to be measured may be the peak-to-peak value of the timing jitter. Additionally, it is preferred that the value of the cycle of the signal-under-test is provided to the strobe timing generator 30.

The maximum value of the difference between the timing for each edge of the signal-under-test and the ideal timing, i.e. timing jitter is determined by the amplitude value of the timing jitter. That is, the amplitude value of jitter makes the timing for each edge of the signal-under-test deviate from the ideal timing. Therefore, the timing for each edge of the signal-under-test may be changed within two-three times of jitter value around the ideal timing. Accordingly, the cycle resolution (Δ) of being less than two or three times of the jitter value can be used to accurately detect the timing jitter (the difference of timing of the signal-under-test and its ideal timing) in the signal-under-test.

Additionally, by setting the cycle resolution (Δ) be less than the time resolution for calculating the jitter value, the jitter value at the time resolution can be more accurately calculated.

FIG. 25 is a diagram showing an example of configuration of a pattern generator 65 included in the testing apparatus 100 shown in FIG. 17. The pattern generator 65 includes a pattern generator 67 for generating the signal pattern of a test signal and a driver 69 for outputting the test signal based on the test pattern. The driver 69 operates according to a predetermined test rate and makes the device under test 200 output signal-under-test at a cycle according to the test rate of the device under test or integer multiple of the test rate. In the present embodiment, the driver 69 receives timing signals at the cycle according to the test rate T and makes the device under test 200 output signal-under-test in accordance with the cycle Meanwhile, the strobe timing generator 30 generates strobe signals at a cycle t+Δ larger than a test rate T by a predetermined value. By such operation, a high-speed signal-under-test can be accurately measured at a low operational cycle speed. It is preferred that the strobe timing generator 30 has plural kinds of cycle resolutions Δ of the strobe signal which can be selected as the test rate T. For example, the timing generator 30 has plural sets of timings which can be set thereto, and the cycle resolutions Δ of the test rate and that of the strobe signal when each timing being set may be measured in advance.

Among those timing set the strobe timing generator 30 may select a timing set at which the cycle resolution Δ is minimized, and also may select a timing set at which the cycle resolution Δ is less than two-three times of the jitter value to be measured.

FIG. 26 shows an example of instantaneous phase φ(t), linear phase and instantaneous phase noise Δφ(t) of the signal-under-test described in FIG. 21. An upper diagram shows the instantaneous phase φ(t) and a linear phase $2\pi f_0 t + \phi_0$ of the signal-under-test and a lower diagram shows the instantaneous phase noise Δφ(t) of the signal-under-test. The testing apparatus 100 may calculates $(\phi_0|_2 - \phi_0|_1)/(2\pi f_0)$ based on the value of the instantaneous phase φ(t) of two signals at a predetermined time to obtain a deterministic skew between two signals. Here, the deterministic skew is the different between electrical lengths of the paths through which two signals are propagated The testing apparatus may calculate $(\Delta\phi(t)|_2 - \Delta\phi(t)|_1)/(2\pi f_0)$ to obtain a random skew between two signals.

For example, the testing apparatus 100 includes two comparators 20 in parallel. Signals are inputted to those comparators 20 at the same time. Additionally, the same strobe signals are provided to those comparators. That is to say, the testing apparatus 100 undersamples two signals inputted to the comparators 20 at the same time.

Then, the testing apparatus 100 calculates the instantaneous phase φ(t) for each of the signals, and calculates the value for each of the instantaneous phases φ(t) at a predetermined time (e.g. t=0). Thereby the difference between the estimated values indicates the deterministic skew. Such processing may be performed by the digital signal converting section 50 and the digital signal processing section 60. Additionally, the testing apparatus 100 may include two capture memories 40 corresponding to two comparators 20. The digital signal converting section 50 receives data from two capture memories 40 and calculates the above-described deterministic skew and random skew.

Figure 27:
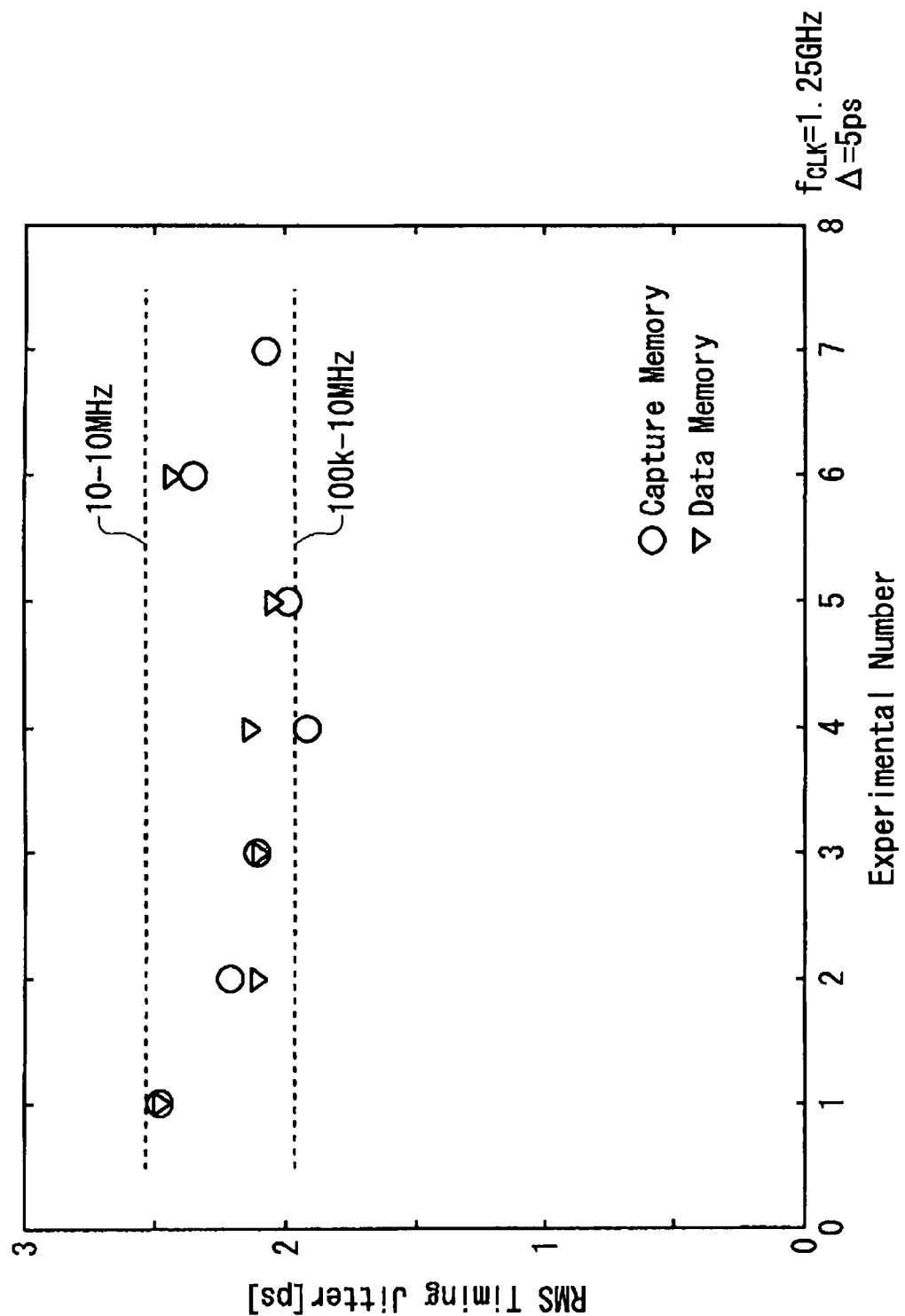
FIG. 27 is a diagram showing a comparison between the result of measuring jitter by the testing apparatus 100 and the result of measuring jitter by the conventional jitter measuring apparatus.

FIG. 27 is a diagram showing a comparison between the result of measuring jitter by the testing apparatus 100 and the result of measuring jitter by a jitter measuring apparatus E5052A. In FIG. 27, the range of the results of measured jitter values are shown by dotted lines. The jitter measuring apparatus may be a typical measurement apparatus having a function for measuring jitter.

Additionally, the resultant values of measured jitter by the testing apparatus 100 are indicated by circles and triangles in FIG. 27. As shown in FIG. 27, the measurement results by the testing apparatus 100 are well matched with the measurement results by the measuring apparatus used for measuring jitter. That is, it is indicated that the testing apparatus 100 can accurately measure jitter.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As it is apparent from the above description, the invention enables the jitter test of the device-under-test to be performed at low cost. Still more, it enables the timing jitter to be accurately measured because it allows the timing noise to be measured by separating the measurement from amplitude noise. It also allows the measurement to be performed at speed higher than the maximum frequency of the strobe signal generated by the strobe timing generator.

The Appendix is incorporated herein as a part of the specification by reference.

What is claimed is:

1. A measuring apparatus for measuring a signal-under-test, comprising:
   a comparator for sequentially comparing voltage values of the signal-under-test with a threshold voltage value fed thereto at timing of strobe signals sequentially fed thereto;
   a strobe timing generator for sequentially generating the strobe signals placed almost at equal time intervals;
   a capture memory for storing the comparison result of the comparator, and
   a digital signal processing section for calculating jitter of the signal-under-test based on the comparison result stored in the capture memory.

2. The measuring apparatus as set forth in claim 1, wherein the strobe timing generator sequentially generates the strobe signals at a cycle different from that of the signal-under-test.

3. The measuring apparatus as set forth in claim 2, wherein the strobe timing generator sequentially generates the strobe signals at a cycle larger than half of that of the signal-under-test.

4. The measuring apparatus as set forth in claim 2, wherein the strobe timing generator sequentially generates the strobe signals such that the difference between the cycle of the strobe signal and that of the signal-under-test is an equivalent sampling interval dependent on a jitter value to be measured.

5. The measuring apparatus as set forth in claim 4, wherein the strobe timing generator provides the jitter value to be measured and sequentially generates the strobe signals such that the difference between the cycle of the strobe signal and that of the signal-under-test is less than N times of jitter value, where N is a positive integer.

6. The measuring apparatus as set forth in claim 2, wherein the strobe timing generator sequentially generates the strobe signals such that the difference between the cycle of the strobe signal and that of the signal-under-test is a value dependent on a time resolution determined by a jitter of the signal value under test.

7. The measuring apparatus as set forth in claim 6, wherein the strobe timing generator sequentially generates the strobe signals such that the time resolution for calculating jitter is provided, and the difference between the cycle of the strobe signal and that of the signal-under-test is less than the time resolution.

8. The measuring apparatus as set forth in claim 2, wherein the digital signal processing section divides the cycle of the signal-under-test by the difference between the cycle of the strobe signal and that of the signal-under-test, retrieves continuous data with the number of points which is integral multiple of the division result among the data of the comparison results stored in the capture memory in chronological order and calculates the jitter based on the retrieved data.

9. The measuring apparatus as set forth in claim 8, wherein the digital signal processing section calculates the jitter based on a result obtained by performing a Fast Fourier Transform on the retrieved data when the number of points of the retrieved data is power-of-two, and calculates the jitter based on a result obtained by performing a mixed radix Fourier Transform, a prime factor Fourier Transform and a split-radix Fourier Transform on the retrieved data with algorithm.

10. The measuring apparatus as set forth in claim 1, further comprising a digital signal converting section for generating a digital signal in which each voltage value of the signal-under-test is converted into a digital value whose absolute value falls within a range smaller than n (where, n is a real number) based on the comparison result stored in the capture memory;
   wherein the digital signal processing section calculates the jitter of the signal-under-test based on the digital signal.

11. The measuring apparatus as set forth in claim 10, wherein the digital signal processing section comprises: a band limiting section for passing frequency components to be measured of the digital signal; and a phase distortion estimating section for calculating phase noise of the digital signal outputted out of the band limiting section.

12. The measuring apparatus as set forth in claim 11, wherein the band limiting section converts the digital signal into an analog signal; and the phase distortion estimating section has an instantaneous phase estimating section for generating an instantaneous phase signal representing the instantaneous phase of the signal-under-test; and a linear phase removing section for removing a linear component of the instantaneous phase signal to calculate phase noise of the signal-under-test.

13. The measuring apparatus as set forth in claim 11, wherein the phase distortion estimating section comprises: a zero-crossing timing estimating section for estimating zero-crossing timing series of the signal-under-test based on the digital signals outputted out of the band limiting section; and a linear phase removing section for removing a linear component of the zero-crossing timing series to calculate phase noise of the signal-under-test.

14. The measuring apparatus as set forth in any one of claim 11-claim 13, wherein the filter passes frequency components of frequency a band containing no carrier frequency of the signal-under-test among frequency components of the signal-under-test.

15. The measuring apparatus as set forth in claim 1 or 10, wherein the comparator outputs comparison results different from each other depending on whether or not the voltage value of the signal-under-test is greater than the threshold voltage value.

16. The measuring apparatus as set forth in claim 15, wherein the digital value converting section converts the comparison result representing that the voltage value of the signal-under-test is greater than the threshold voltage value into a digital value of 1 and converts the comparison result representing that the voltage value of the signal-under-test is smaller than the threshold voltage value into a digital value of −1.

17. The measuring apparatus as set forth in claim 1 or 10, wherein the comparator provides first one of the threshold voltage and second one of the threshold voltage whose voltage value is lower than the first threshold voltage and outputs comparison results different from each other depending on whether or not the voltage value of the signal-under-test is greater than the first threshold voltage, whether or not the voltage value of the signal-under-test is smaller than the first threshold voltage and greater than the second threshold voltage or whether the voltage value of the signal-under-test is smaller than the second threshold voltage.

18. The measuring apparatus as set forth in claim 17, wherein the digital signal converting section converts the comparison result indicating that the voltage value of the signal-under-test is greater than the first threshold voltage value into a digital value 1, converts the comparison result indicating that the voltage value of the signal-under-test is smaller than the first threshold voltage value and is greater than the second threshold voltage value into a digital value 0 and converts the comparison result indicating that the voltage value of the signal-under-test is smaller than the second threshold voltage value into a digital value −1.

19. The measuring apparatus as set forth in claim 1 or 10, wherein the comparator provides three or more different threshold voltage values and outputs comparison results different from each other depending on a voltage range specified by two neighboring threshold voltages to which the voltage value of the signal-under-test belongs.

20. The measuring apparatus as set forth in claim 1, wherein the strobe timing generator generates the strobe signals placed almost at equal time intervals independently of operation periods of the measuring apparatus.

21. The measuring apparatus as set forth in claim 1, wherein the strobe timing generator generates one of the strobe signals per operation period of the measuring apparatus.

22. The measuring apparatus as set forth in claim 1, wherein the strobe timing generator generates the plurality of strobe signals per operation period of the measuring apparatus.

23. The measuring apparatus as set forth in claim 1, further comprising a plurality of comparators arranged in parallel; and an input section for inputting the signal-under-test into each one of the plurality of comparators in parallel; wherein the strobe timing generator inputs the strobe signals whose phases are different to the respective comparators; and the capture memory aligns and stores the comparison results in the plurality of comparators in accordance with phases of the corresponding strobe signals.

24. A testing apparatus for testing a device-under-test, comprising:
    a measuring apparatus for measuring jitter of a signal-under-test outputted out of the device-under-test; and
    a jitter judging section for judging whether or not the device-under-test is defect free based on the jitter measured by the measuring apparatus;
    wherein the measuring apparatus comprises:
    a comparator for sequentially comparing voltage values of the signal-under-test with a threshold voltage value given thereto at liming of strobe signals sequentially fed thereto;
    a strobe timing generator for sequentially generating the strobe signals placed almost at equal time intervals;
    a capture memory for storing comparison results of the comparator, and
    a digital signal processing section for calculating the jitter of the signal-under-test based on the comparison results stored in the capture memory.

25. The testing apparatus as set forth in claim 24, wherein the strobe timing generator sequentially generates the strobe signals at a cycle different from that of the signal-under-test.

26. The testing apparatus as set forth in claim 25, further comprising a driver that operates according to a predetermined test rate, for causing the device-under-test to output the signal-under-test at the cycle according to the test rate,
    the strobe timing generator sequentially generates the strobe signals at a cycle lower than the test rate by a predetermined value.

27. The testing apparatus as set forth in claim 24, further comprising a logic judging section for judging whether or not a data pattern of the signal-under-test determined by the comparison results stored in the capture memory coincides with a preset expected value pattern.

28. A measuring method for measuring a signal-under-test having a predetermined period, comprising:
    a comparing step of sequentially comparing voltage values of the signal-under-test with a given threshold voltage value at timing of strobe signals sequentially given;
    a strobe timing generating step of sequentially generating the strobe signals placed almost at equal time intervals;
    a storing step of storing comparison results of the comparator, and
    a digital signal processing step of calculating the jitter of the signal-under-test based on the comparison results stored in the storing step.

29. A testing method for testing a device-under-test, comprising:
    a measuring step of measuring jitter of a signal-under-test outputted out of the device-under-test;
    a jitter judging step of judging whether or not the device-under-test is defect-free based on the jitter measured in the measuring step;
    wherein the measuring step includes:
    a comparing step of sequentially comparing voltage values of the signal-under-test with a given threshold voltage value at timing of strobe signals sequentially given;
    a strobe timing generating step of sequentially generating the strobe signals placed almost at equal time intervals;
    a storing step of storing comparison results of the comparator, and
    a digital signal processing step of calculating the jitter of the signal-under-test based on the comparison results stored in the storing step.

30. A measuring apparatus for measuring a signal-under-test having a predetermined period, comprising:
    a comparator for sequentially comparing a voltage value of the signal-under-test, a first threshold voltage value and a second threshold voltage value given thereto at timing of strobe signals sequentially given thereto to output comparison results of three values;
    a capture memory for storing the comparison result of the comparator, and
    a digital signal processing section for calculating jitter of the signal-under-test based on the comparison result stored in the capture memory.

31. The measuring apparatus as set forth in claim 30, wherein the digital signal processing section comprises:
    a Hilbert transformation pair generating section for transforming the comparison result into an analog signal;
    an instantaneous phase estimating section for generating an instantaneous phase signal representing an instantaneous phase of the signal-under-test based on the analog signal; and
    a linear phase removing section for removing a linear phase of the instantaneous phase signal to present phase noise of the signal-under-test.

32. An electronic device for outputting a signal-under-test, comprising:
    an operation circuit for generating the signal-under-test; and
    a measuring apparatus for measuring the signal-under-test;
    wherein the measuring apparatus comprises:
    a comparator for sequentially comparing a voltage value of the signal-under-test with a threshold voltage value given thereto at timing of strobe signals sequentially given thereto; and a capture memory for storing the comparison result of the comparator.

33. The electronic device as set forth in claim 32, further comprising a strobe timing generator for sequentially generating strobe signals arranged almost at equal time intervals.

34. The electronic device as set forth in claim 33, wherein the strobe timing generator sequentially generates the strobe signals at a cycle different from that of the signal-under-test by a predetermined value.

35. A measuring apparatus for measuring a signal-under-test, comprising:
- a first comparator for sequentially comparing voltage values of a first signal-under-test with a threshold voltage value fed thereto at timing of strobe signals sequentially fed thereto at a timing at which the strobe signals are sequentially fed thereto;
- a second comparator for sequentially comparing voltage values of a second signal-under-test with a threshold voltage value fed thereto at approximately the same time;
- a strobe timing generator for sequentially generating the strobe signals placed almost at equal time intervals;
- a capture memory for storing the comparison result of the comparator, and
- a digital signal processing section for calculating the instantaneous phase for each of the first signal-under-test and the second signal-under-test based on the comparison result stored in the capture memory and calculating a deterministic skew between the first signal-under-test and the second signal-under-test based on each instantaneous phase.

36. The measuring apparatus as set forth in claim 35, wherein the strobe timing generator sequentially generates the strobe signals at a cycle different from the cycle of the signal-under-test by a predetermined value.

37. The measuring apparatus as set forth in claim 36, wherein the strobe timing generator sequentially generates the strobe signals at a cycle different from the cycle of the signal-under-test by a predetermined value.

38. A measuring apparatus for measuring a signal-under-test, comprising:
- a first comparator for sequentially comparing voltage values of a first signal-under-test with a threshold voltage value fed thereto at timing at which strobe are signals sequentially fed thereto at a timing at which the strobe signals sequentially fed thereto;
- a second comparator for sequentially comparing voltage values of a second signal-under-test with a threshold voltage value fed thereto at approximately the same timing;
- a strobe timing generator for sequentially generating the strobe signals placed almost at equal time intervals;
- a capture memory for storing the comparison result of the comparator, and
- a digital signal processing section for calculating the instantaneous phase for each of the first signal-under-test and the second signal-under-test based on the comparison result stored in the capture memory, calculating the instantaneous phase noise for each of the first signal-under-test and the second signal-under-test based on each instantaneous phase and calculating a random skew between the first signal-under-test and the second signal-under-test based on each instantaneous phase noise.

* * * * *